United States Patent
Sohn et al.

(10) Patent No.: US 11,552,182 B2
(45) Date of Patent: Jan. 10, 2023

(54) INTEGRATED CIRCUIT DEVICES INCLUDING A VERTICAL FIELD-EFFECT TRANSISTOR (VFET) AND METHODS OF FORMING THE SAME

(71) Applicant: Samsung Electronics Co., Ltd., Suwon-si (KR)

(72) Inventors: Chang Woo Sohn, Seoul (KR); Seung Hyun Song, Hwaseong-si (KR); Seon-Bae Kim, Hwaseong-si (KR); Min Cheol Oh, Seoul (KR); Young Chai Jung, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/399,118

(22) Filed: Aug. 11, 2021

(65) Prior Publication Data

US 2021/0376126 A1 Dec. 2, 2021

Related U.S. Application Data

(63) Continuation of application No. 16/798,482, filed on Feb. 24, 2020, now Pat. No. 11,107,906.

(60) Provisional application No. 62/913,261, filed on Oct. 10, 2019.

(51) Int. Cl.
*H01L 29/66* (2006.01)

(52) U.S. Cl.
CPC .... *H01L 29/66666* (2013.01); *H01L 29/6656* (2013.01); *H01L 29/66545* (2013.01)

(58) Field of Classification Search
CPC ......... H01L 29/66666; H01L 29/66545; H01L 29/6656
See application file for complete search history.

(56) References Cited

U.S. PATENT DOCUMENTS

| | | |
|---|---|---|
| 9,711,511 B1 | 7/2017 | Lim et al. |
| 9,722,048 B1 | 8/2017 | Balakrishnan et al. |
| 10,043,797 B2 | 8/2018 | Jun et al. |
| 10,157,928 B2 | 12/2018 | Colinge et al. |
| 10,256,231 B2 | 4/2019 | Cheng et al. |
| 10,290,639 B2 | 5/2019 | Zang |
| 10,312,229 B2 | 6/2019 | Moroz et al. |
| 2009/0065856 A1 | 3/2009 | Oyu et al. |

(Continued)

FOREIGN PATENT DOCUMENTS

KR 101772313 B1 8/2017

*Primary Examiner* — Errol V Fernandes
(74) *Attorney, Agent, or Firm* — Myers Bigel, P.A.

(57) ABSTRACT

Integrated circuit devices and methods of forming the same are provided. The methods may include forming a dummy channel region and an active region of a substrate, forming a bottom source/drain region on the active region, forming a gate electrode on one of opposing side surfaces of the dummy channel region, and forming first and second spacers on the opposing side surfaces of the dummy channel region, respectively. The gate electrode may include a first portion on the one of the opposing side surfaces of the dummy channel region and a second portion between the bottom source/drain region and the first spacer. The methods may also include forming a bottom source/drain contact by replacing the first portion of the gate electrode with a conductive material. The bottom source/drain contact may electrically connect the second portion of the gate electrode to the bottom source/drain region.

20 Claims, 40 Drawing Sheets

(56) References Cited

U.S. PATENT DOCUMENTS

| | | |
|---|---|---|
| 2009/0078993 A1 | 3/2009 | Fujimoto |
| 2018/0005904 A1 | 1/2018 | Lee et al. |
| 2018/0121593 A1 | 5/2018 | Anderson et al. |
| 2018/0248034 A1 | 8/2018 | Leobandung |
| 2018/0337256 A1 | 11/2018 | Anderson et al. |
| 2019/0027586 A1 | 1/2019 | Zang et al. |
| 2019/0081157 A1 | 3/2019 | Cheng et al. |

INTEGRATED CIRCUIT DEVICES INCLUDING A VERTICAL FIELD-EFFECT TRANSISTOR (VFET) AND METHODS OF FORMING THE SAME

CROSS-REFERENCE TO RELATED APPLICATIONS

This application is a continuation of U.S. patent application Ser. No. 16/798,482, filed Feb. 24, 2020, which claims priority to U.S. Provisional Application Ser. No. 62/913,261, entitled FORMATION OF SELF-ALIGNED CONTACT IN SRAM ACTIVE REGION USING FIN STRUCTURE, filed in the USPTO on Oct. 10, 2019, the disclosures of which are hereby incorporated by reference herein in their entireties.

FIELD

The present disclosure generally relates to the field of electronics and, more particularly, to vertical field-effect transistor (VFET) devices.

BACKGROUND

Various structures and manufacturing processes of VFET devices have been researched because of their high scalability. Therefore, developing manufacturing processes that improve performance and/or reliability of VFET devices may be beneficial.

SUMMARY

According to some embodiments of the inventive concept, methods of forming an integrated circuit device may include forming a dummy channel region on a substrate and then forming the active region. The dummy channel region may be provided adjacent to a corner of an active region. Because the dummy channel region is formed before forming the active region, the active region may have corners having the same or similar shape each other. After forming the active region, the method may also include forming a gate structure and spacers on side surfaces of the dummy channel region. The dummy channel region may be removed to form a bottom source/drain contact or may be converted to a portion of the bottom source/drain contact. Because of the spacers formed on the side surfaces of the dummy channel region, the bottom source/drain contact may be self-aligned between the spacers.

According to some embodiments of the present inventive concept, methods of forming an integrated circuit device may include forming a dummy channel region and an active region of a substrate, forming a bottom source/drain region on the active region, forming a gate electrode on one of opposing side surfaces of the dummy channel region, and forming first and second spacers on the opposing side surfaces of the dummy channel region, respectively. The gate electrode may include a first portion on the one of the opposing side surfaces of the dummy channel region and a second portion between the bottom source/drain region and the first spacer. The methods may also include forming a bottom source/drain contact by replacing the first portion of the gate electrode with a conductive material. The bottom source/drain contact may electrically connect the second portion of the gate electrode to the bottom source/drain region.

According to some embodiments of the present inventive concept, methods of forming an integrated circuit device may include forming a bottom source/drain region on an active region of a substrate, forming a bottom spacer on the bottom source/drain region, forming a gate electrode on the bottom spacer, and forming a first spacer and a second spacer on the bottom spacer. The gate electrode may be between the bottom spacer and the first spacer. The methods may also include forming a bottom source/drain contact between the first spacer and the second spacer. The bottom source/drain contact may contact both the gate electrode and the bottom source/drain region.

According to some embodiments of the present inventive concept, integrated circuit devices may include a bottom source/drain region on an active region of a substrate, and a plurality of spacers on the bottom source/drain region. The plurality of spacers may be spaced apart from each other and may include a first spacer and a second spacer. The integrated circuit devices may also include a bottom spacer extending between the bottom source/drain region and the plurality of spacers, a gate electrode between the bottom spacer and the first spacer, and a bottom source/drain contact between the first spacer and the second spacer. The bottom source/drain contact may contact both the first spacer and the second spacer and may electrically connect the gate electrode to the bottom source/drain region.

BRIEF DESCRIPTION OF THE DRAWINGS

FIGS. 3 and 6 are plan views, FIGS. 4 and 5 are cross-sectional views taken along the line A-A' and the line B-B' in FIG. 3, respectively, and FIGS. 7 and 8 are cross-sectional views taken along the line C-C' and the line D-D' in FIG. 6, respectively.

FIGS. 11, 14, 17, and 20 are plan views, and FIGS. 12 and 13 are cross-sectional views taken along the line E-E' and the line F-F' in FIG. 11, respectively. FIGS. 15 and 16 are cross-sectional views taken along the line G-G' and the line H-H' in FIG. 14, respectively. FIGS. 18 and 19 are cross-sectional views taken along the line I-I' and the line J-J' in FIG. 17, respectively. FIGS. 21, 23, 25, 27, and 29 are cross-sectional views taken along the line K-K' of FIG. 20, and FIGS. 22, 24, 26, 28, and 30 are cross-sectional views taken along the line L-L' of FIG. 20.

FIGS. 31, 33, and 35 are cross-sectional views taken along the line K-K' of FIG. 20, and FIGS. 32, 34, and 36 are cross-sectional views taken along the line L-L' of FIG. 20.

FIG. 37 is a plan view, FIGS. 38 and 39 are cross-sectional views taken along the line M-M' of FIG. 37.

DETAILED DESCRIPTION

Figure 1:
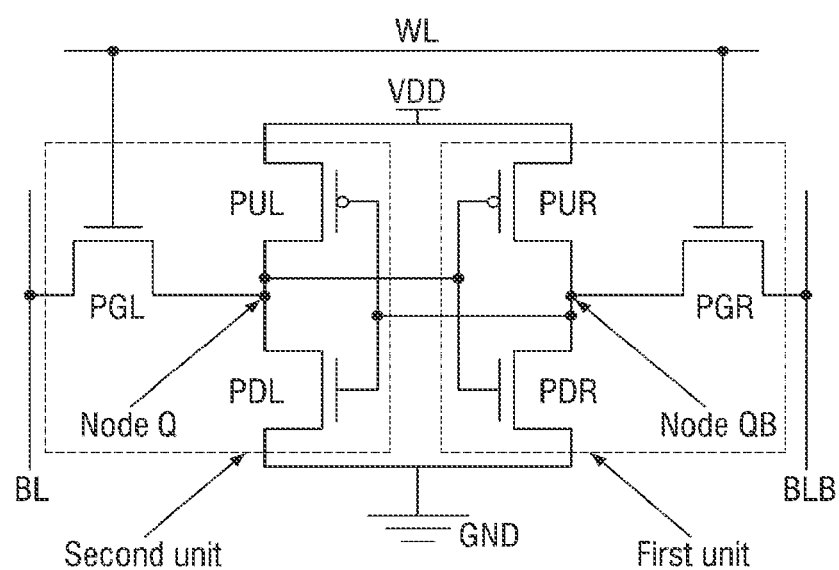
FIG. 1 is a circuit diagram of a 6T SRAM.

Various standard cells may be used to form integrated circuit devices. One example of standard cells is a six transistor Static Random-Access Memory (6T SRAM) cell. Referring to FIG. 1, the 6T SRAM may include a first unit including three transistors (i.e., a first pull up transistor PUR, a first pull down transistor PDR, and a first gate transistor PGR) and a second unit including three transistors (i.e., a second pull up transistor PUL, a second pull down transistor PDL, and a second gate transistor PGL). Each of the transistors of the first unit and the second unit may be a VFET. In FIG. 1, WL refers to a word line, both BL and BLB refer to bit lines, VDD refers to a first operating voltage, and GND refers to a second operating voltage (e.g., ground voltage).

Figure 2:
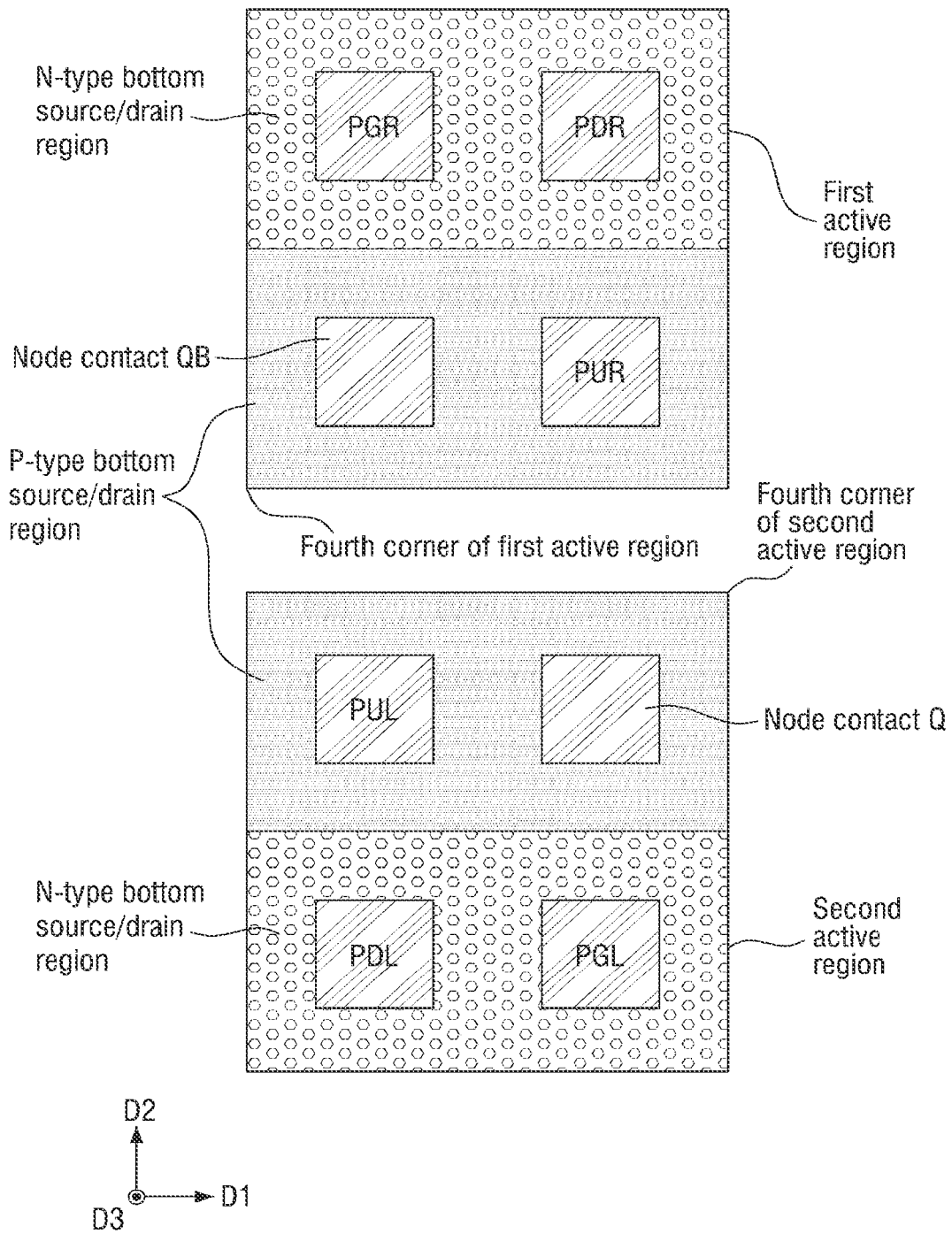
FIG. 2 is a schematic diagram of the 6T SRAM of FIG. 1.

Referring to FIG. 2, the three transistors of the first unit may be on a first active region. Each of the three transistors of the first unit may be adjacent to one of first, second, and third corners of the first active region, and a node contact QB may be adjacent to a fourth corner of the first active region. The three transistors of the second unit may be on a second active region. Each of the three transistors of the second unit may be adjacent to one of first, second, and third corners of the second active region, and a node contact Q may be adjacent to a fourth corner of the second active region.

Figure 29:
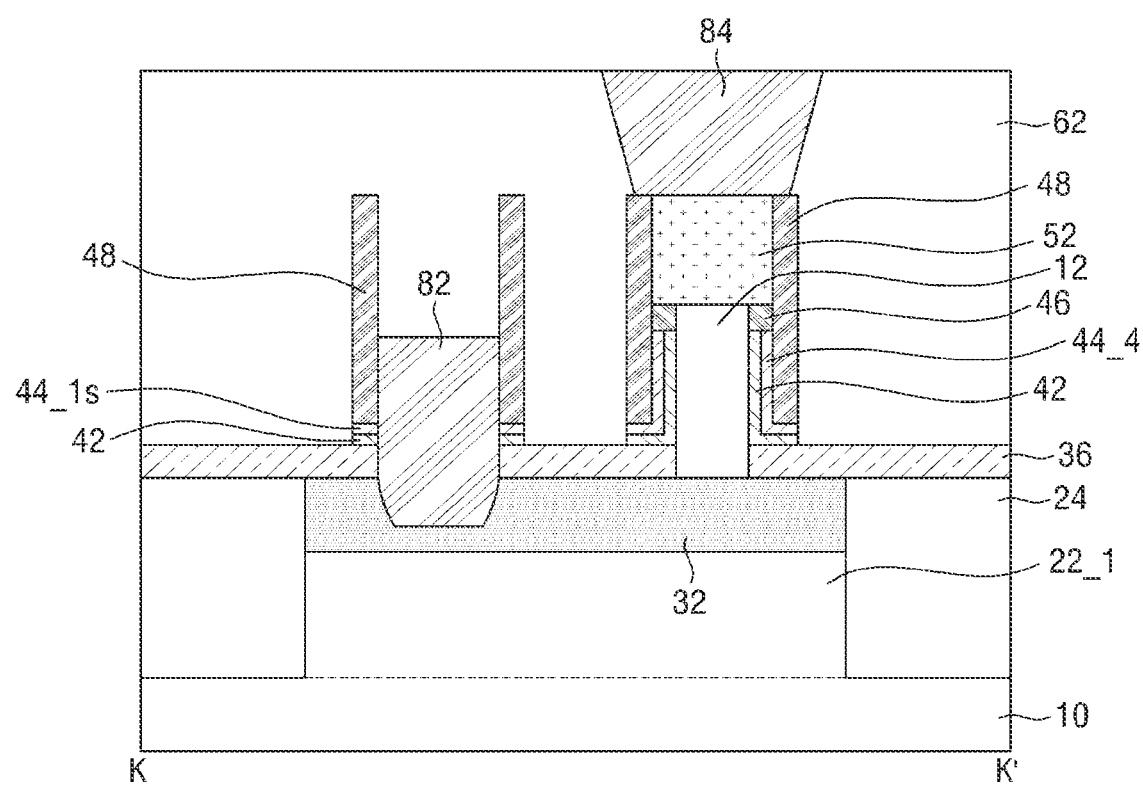
Figure 29:
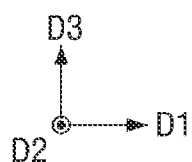
Figure 30:
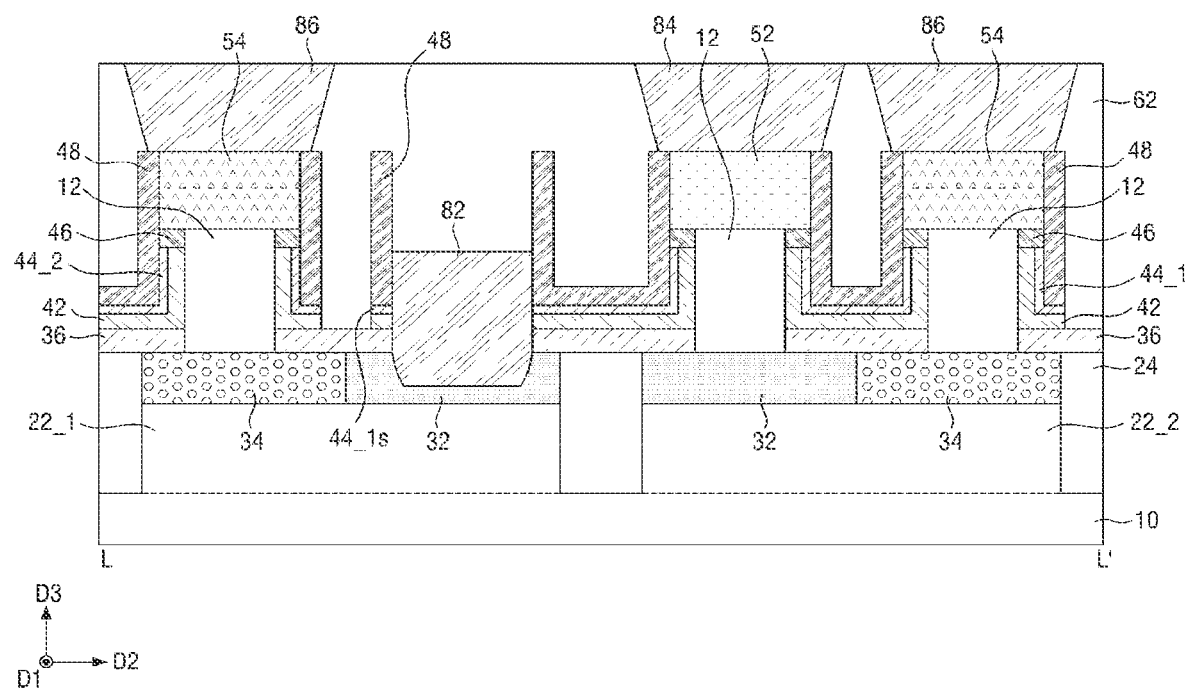

Each of the node contact Q and the node contact QB may be a conductive contact, rather than a transistor, and thus the node contact Q and the node contact QB may not include a channel region (e.g., 12 in FIGS. 29 and 30). Accordingly, a channel region may not be provided adjacent to the fourth corner of the first active region and the fourth corner of the second active region.

Referring to FIGS. 1 and 2, each of the first pull down transistor PDR, the first gate transistor PGR, the second pull down transistor PDL, and the second gate transistor PGL may be an N-type transistor and may include an N-type bottom source/drain region. Each of the first pull up transistor PUR and the second pull up transistor PUL may be a P-type transistor and may include a P-type bottom source/drain region.

Figure 3:
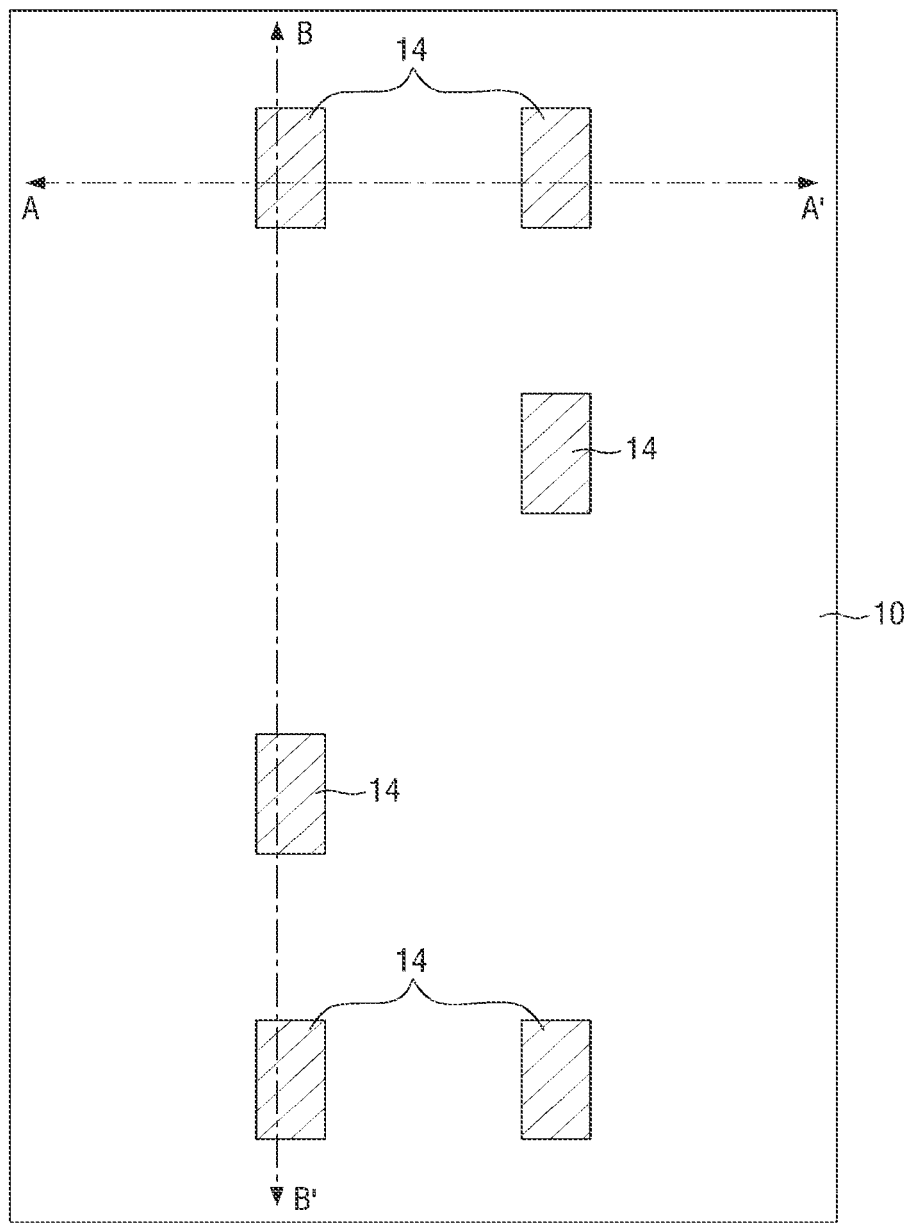
FIGS. 3 through 8 are views illustrating a method of forming the 6T SRAM of FIG. 2 according to some embodiments of the inventive concept.
Figure 4:
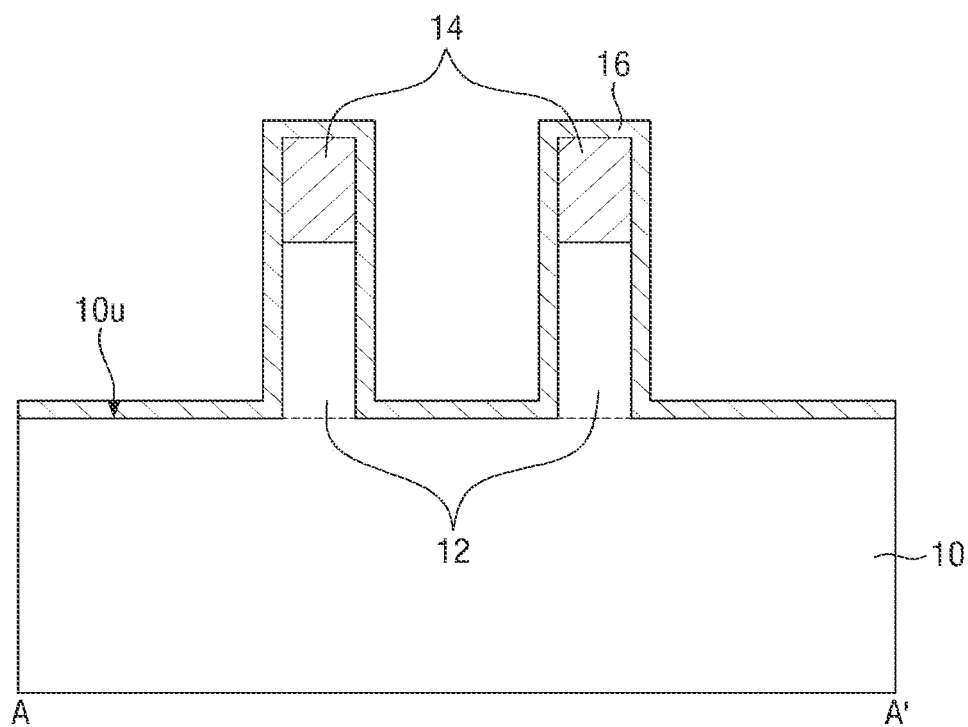
Figure 4:
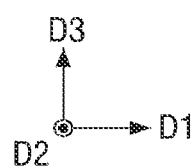
Figure 5:
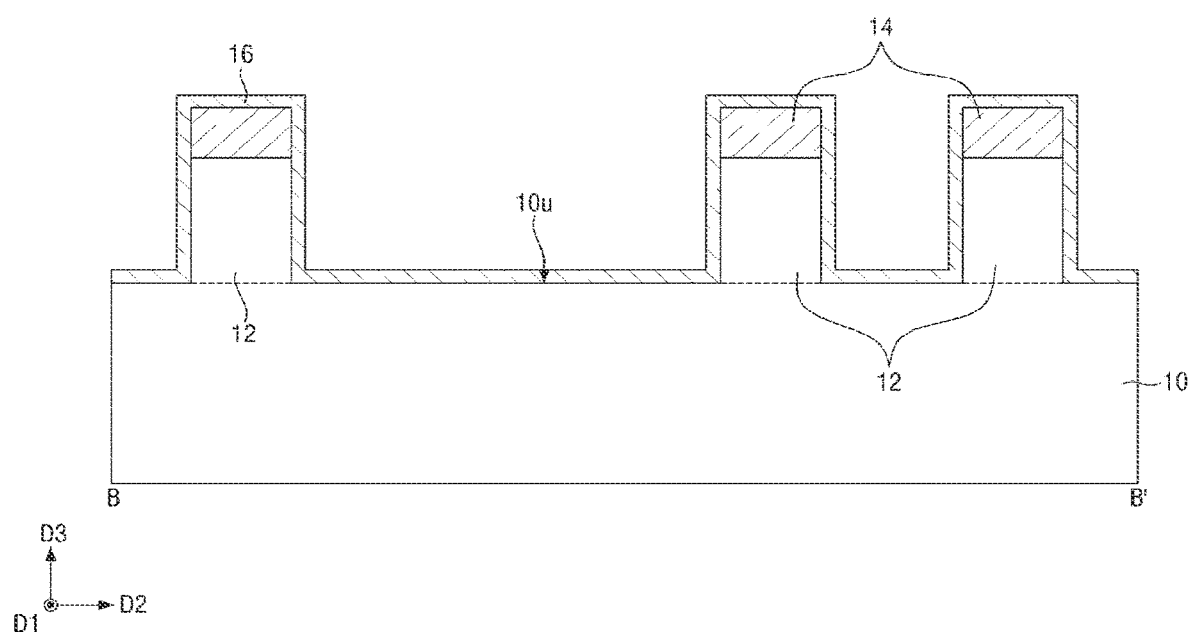

Referring to FIGS. 3, 4, and 5, channel regions 12 may be formed on a substrate 10 by etching the substrate 10 using mask layers 14 as an etch mask. To show mask layers 14, FIG. 3 does not show a liner 16. Each of the channel regions 12 may be a channel region of one of six transistors of the 6T SRAM of FIG. 2. The mask layers 14 may include a material having an etch selectivity with respect to the substrate 10. For example, the mask layers 14 may include a photo resist material, a hard mask material, and/or a silicon layer including nitrogen and/or oxygen therein.

Each of the channel regions 12 may protrude from an upper surface 10$u$ of the substrate 10 in a third direction D3. The third direction D3 may be a vertical direction that is perpendicular to the upper surface 10$u$ of the substrate 10. Some of the channel regions 12 may be spaced apart from each other in a first horizontal direction D1 that is parallel to the upper surface 10$u$ of the substrate 10, and some of the channel regions 12 may be spaced apart from each other in a second horizontal direction D2 that is parallel to the upper surface 10$u$ of the substrate 10. The first horizontal direction D1 may traverse the second horizontal direction D2. In some embodiments, the first horizontal direction D1 may be perpendicular to the second horizontal direction D2. In some embodiments, the third direction D3 may be perpendicular to both the first horizontal direction D1 and the second horizontal direction D2.

After the six channel regions 12 are formed, the liner 16 may be formed on the mask layers 14, the channel regions 12, and the substrate 10. In some embodiments, the liner 16 may have a uniform thickness along a surface of the mask layers 14, a surface of the channel regions 12, and the upper surface 10$u$ of the substrate 10 as illustrated in FIGS. 4 and 5.

The liner 16 may include a material having an etch selectivity with respect to the substrate 10. For example, the liner 16 may include a SiN layer and/or SiON layer. In some embodiments, the liner 16 may be a SiN layer. The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate. The channel regions 12 may include the same materials as the substrate 10.

Figure 6:
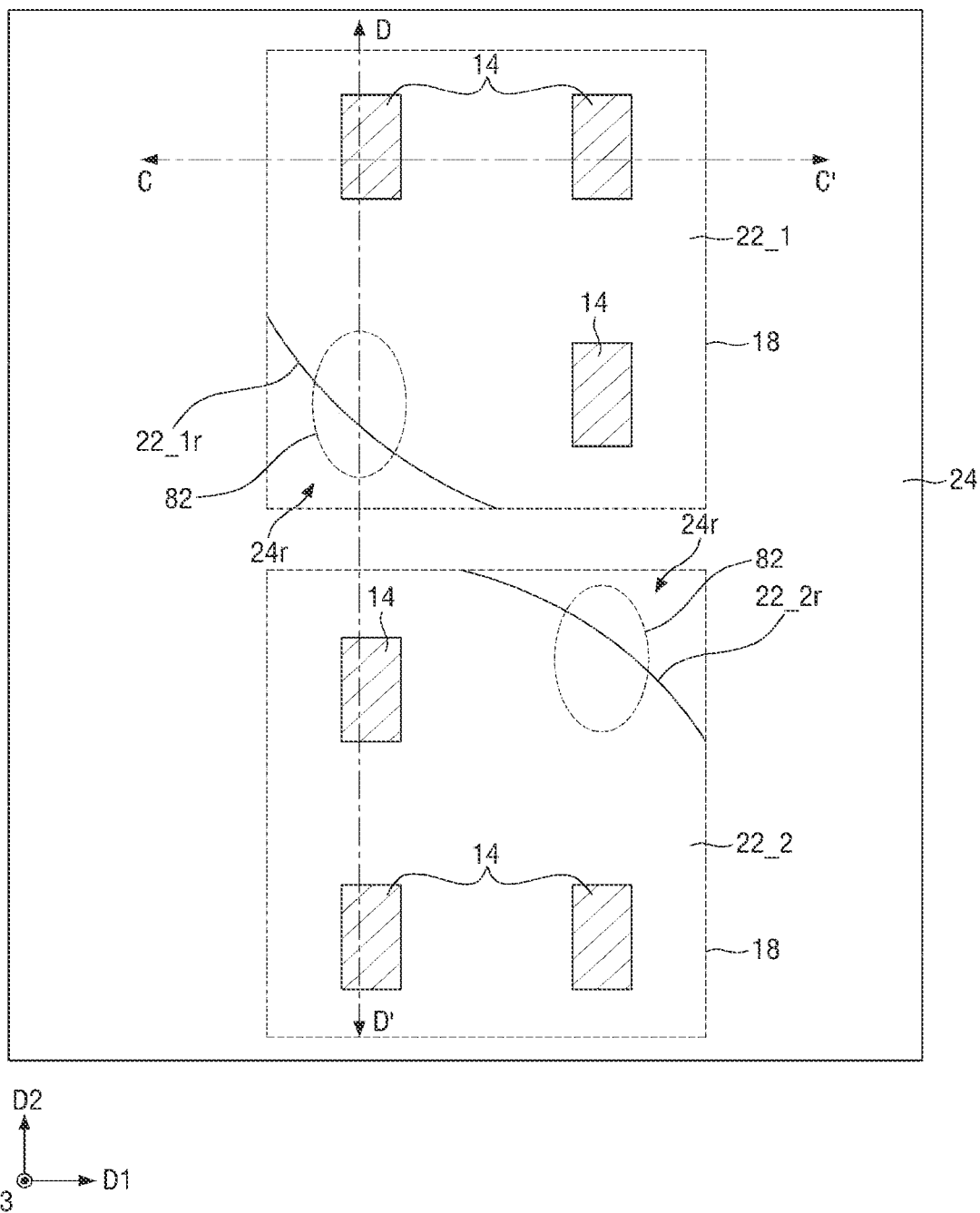
Figure 7:
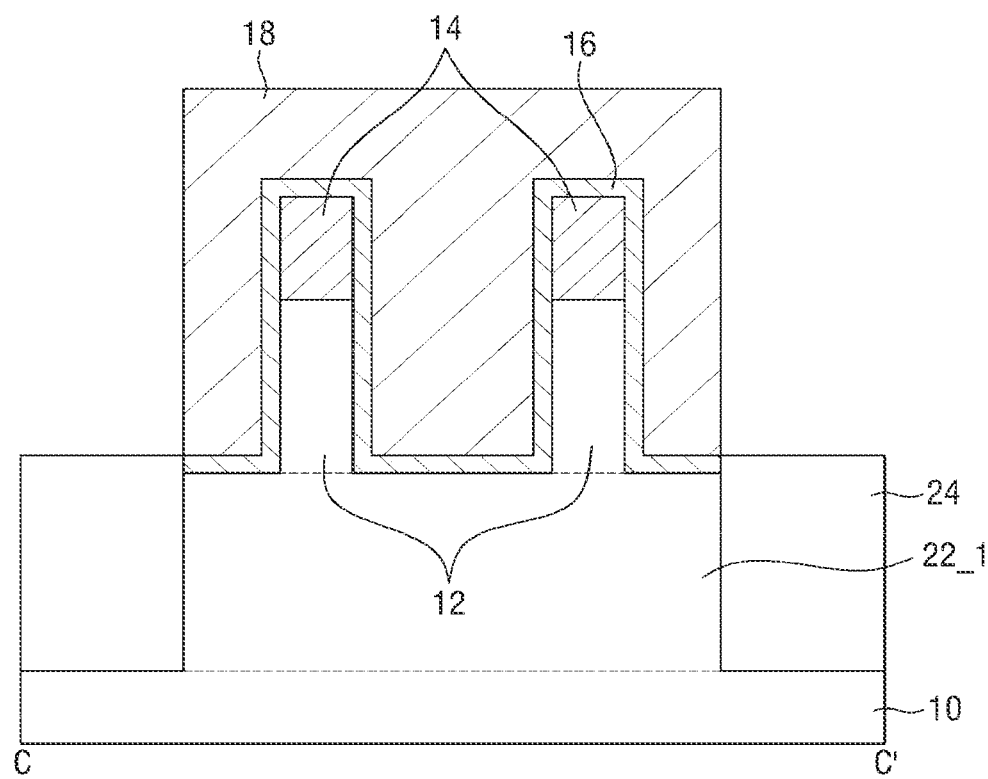
Figure 7:
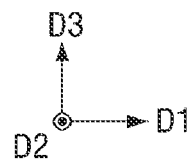
Figure 8:
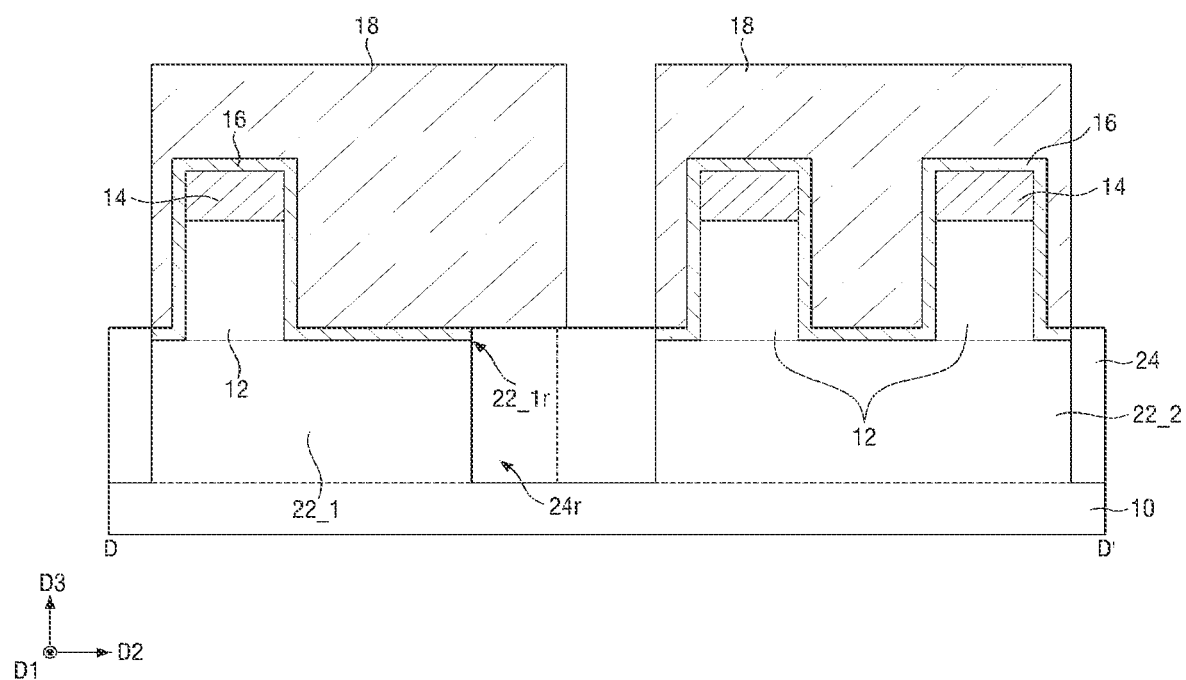

Referring to FIGS. 6, 7, and 8, active mask layers 18 may be formed on the substrate 10, and then the liner 16 and the substrate 10 may be etched to form a first active region 22_1 and a second active region 22_2 on the substrate 10. To show mask layers 14, FIG. 6 does not show the liner 16, and FIG. 6 shows only outlines of the active mask layers 18. Each of the active mask layers 18 may have four corners having the same or similar shape in a plan view. For example, each of the active mask layers 18 may have a rectangle shape in a plan view as illustrated in FIG. 6. The active mask layers refer to mask layers for patterning active regions (e.g., 22_1 and 22_2 in FIGS. 6, 7, and 8).

As illustrated in FIG. 6, each of the first active region 22_1 and the second active region 22_2 may have a rounded corner 22_1$r$ or 22_2$r$ because no channel regions 12 is formed adjacent to the rounded corner 22_1$r$ or 22_2$r$. Each of the first active region 22_1 and the second active region 22_2 may have an area smaller than an area of each of the active mask layers 18 because of the rounded corners 22_1$r$ and 22_2$r$. Accordingly, only a portion of a bottom source/drain contact 82 subsequently formed may overlap the underlying first active region 22_1 or second active region 22_2, and a contact resistance between the bottom source/drain contact 82 and the underlying first active region 22_1 or second active region 22_2 may increase compared to when the bottom source/drain contact 82 entirely overlaps the underlying first active region 22_1 or second active region 22_2.

Still referring to FIGS. 6, 7, and 8, a field isolation layer 24 may be formed on side surfaces of the first active region 22_1 and the second active region 22_2. Because of the rounded corners 22_1$r$ and 22_2$r$ of the first active region 22_1 and the second active region 22_2, the field isolation layer 24 may include round portions 24$r$ that are overlapped by the active mask layers 18. The bottom source/drain contact 82 may overlap and contact the round portion 24$r$ of the field isolation layer 24 as illustrated in FIG. 6.

According to some embodiments of the inventive concept, a method of forming an integrated circuit device may include forming channel regions (e.g., 12 and 12$d$ in FIGS. 13 and 14) adjacent to all four corners of an active region (e.g., 22_1 or 22_2 in FIGS. 17 through 19), and then one of the channel regions (e.g., 12$d$ in FIGS. 12 and 13) may be removed to form a bottom source/drain contact (e.g., 82 in FIGS. 27 and 35) or converted to a portion of the bottom source/drain contact.

Figure 9:
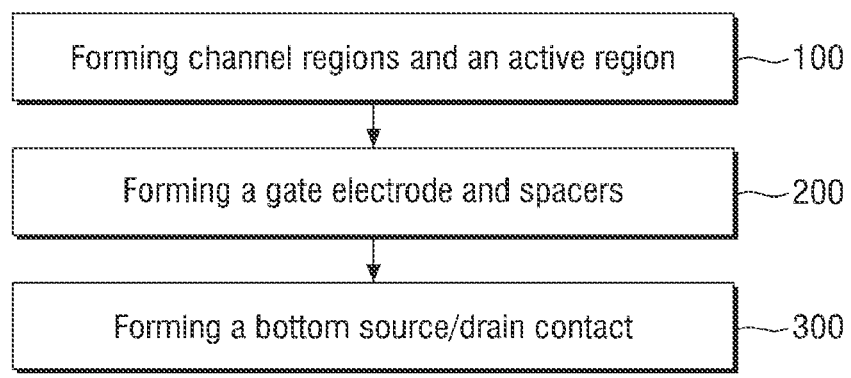
FIGS. 9 and 10 are flow charts of methods of forming the 6T SRAM in FIGS. 1 and 2 according to some embodiments of the inventive concept.
Figure 10:
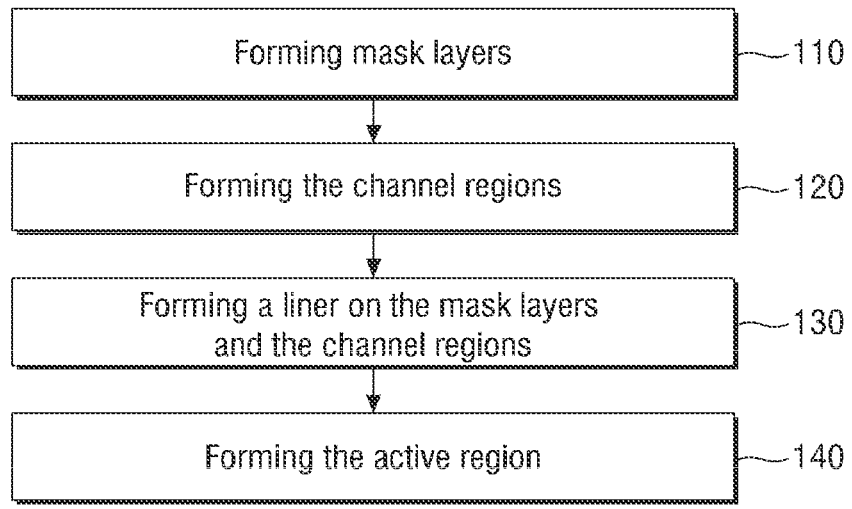
Figure 11:
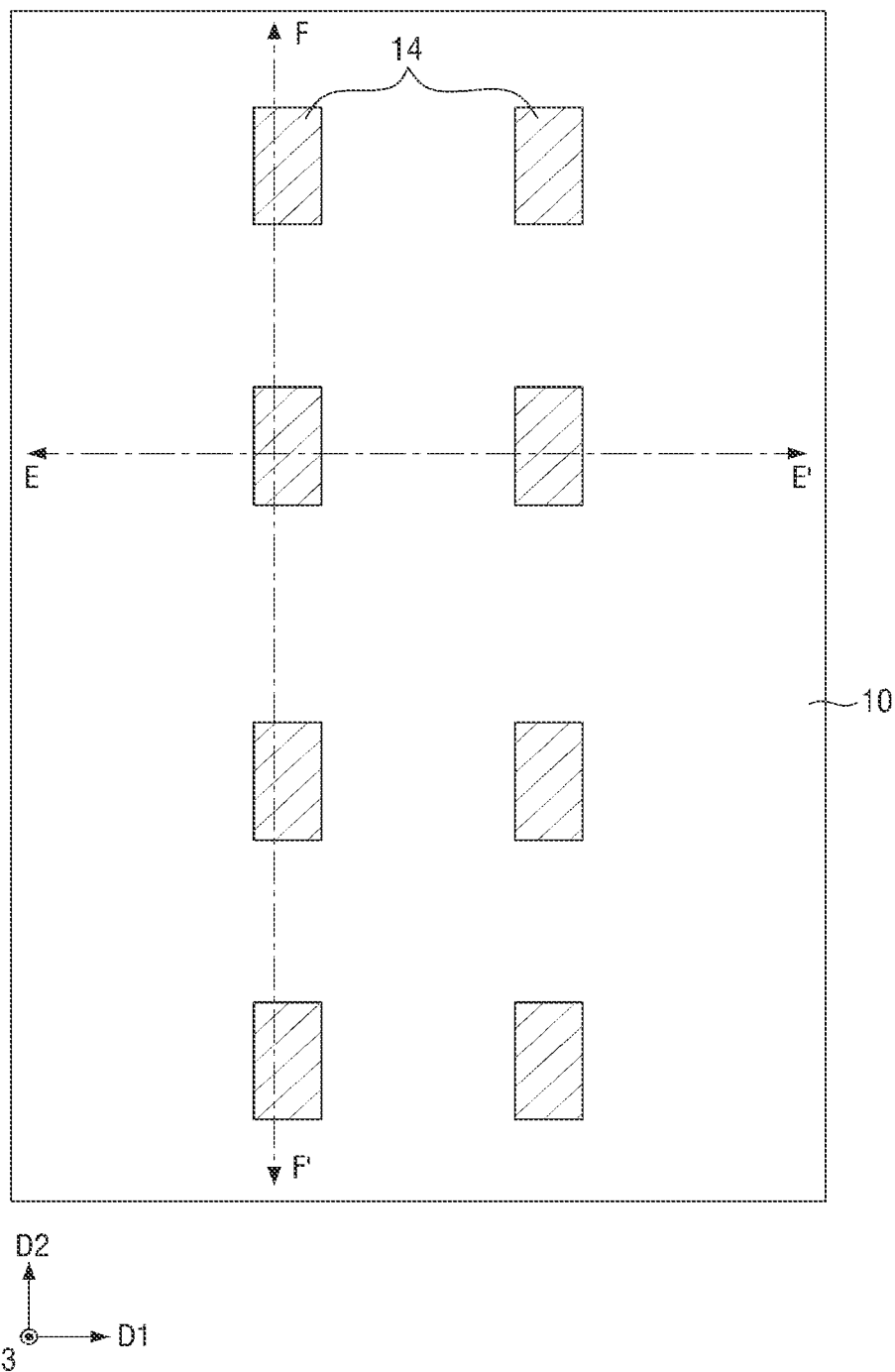
FIGS. 11 through 30 are views illustrating a method of forming the 6T SRAM according to some embodiments of the inventive concept.

Referring to FIG. 9, a method of forming an integrated circuit device according to some embodiments of the inventive concept may include forming channel regions and an active region (Block 100), forming a gate electrode and spacers (Block 200), and then forming a bottom source/drain contact (Block 300).

Referring to FIGS. 10 through 13, forming the channel regions and the active region (Block 100 in FIG. 9) may include forming mask layers 14 on a substrate 10 (Block 110) and forming the channel regions 12 by etching the substrate 10 using the mask layers 14 as an etch mask (Block 120). The channel regions 12 may include a dummy channel region 12d that will not be a channel region of a VFET. The dummy channel region 12d may be removed or may be converted to a portion of a bottom source/drain contact (e.g., 82 in in FIGS. 27 and 35) during subsequent processes. Throughout the specification, removing a layer X may mean etching the layer X using a wet etch process and/or a dry etch process.

Figure 12:
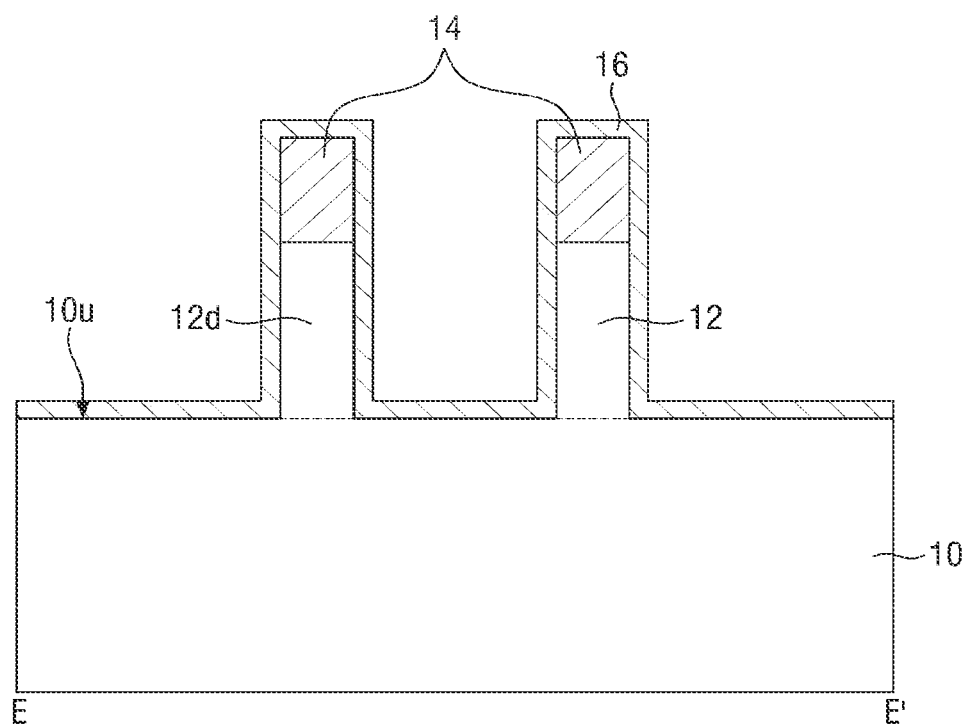
Figure 12:
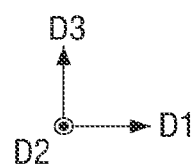
Figure 13:
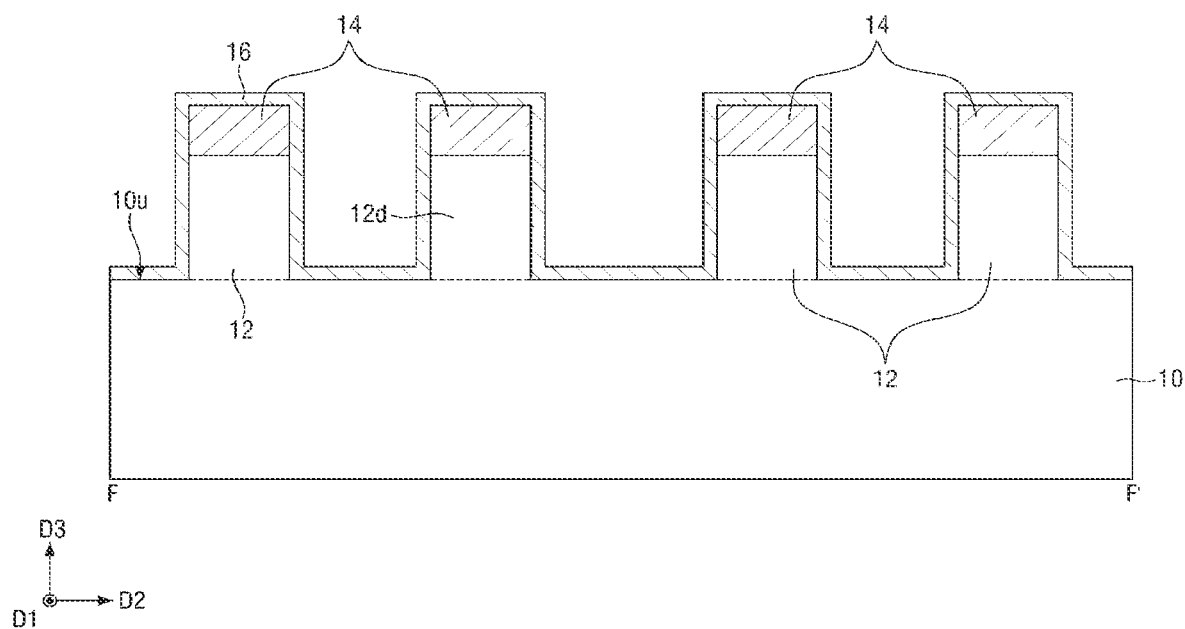

Forming the channel regions and the active region (Block 100 in FIG. 9) may also include forming a liner 16 on the mask layers 14, the channel regions 12, and the substrate 10 (Block 130). The liner 16 may have a uniform thickness along surfaces of the mask layers 14 and the channel regions 12 and along the upper surface 10u of the substrate 10 as illustrated in FIGS. 12 and 13.

Figure 14:
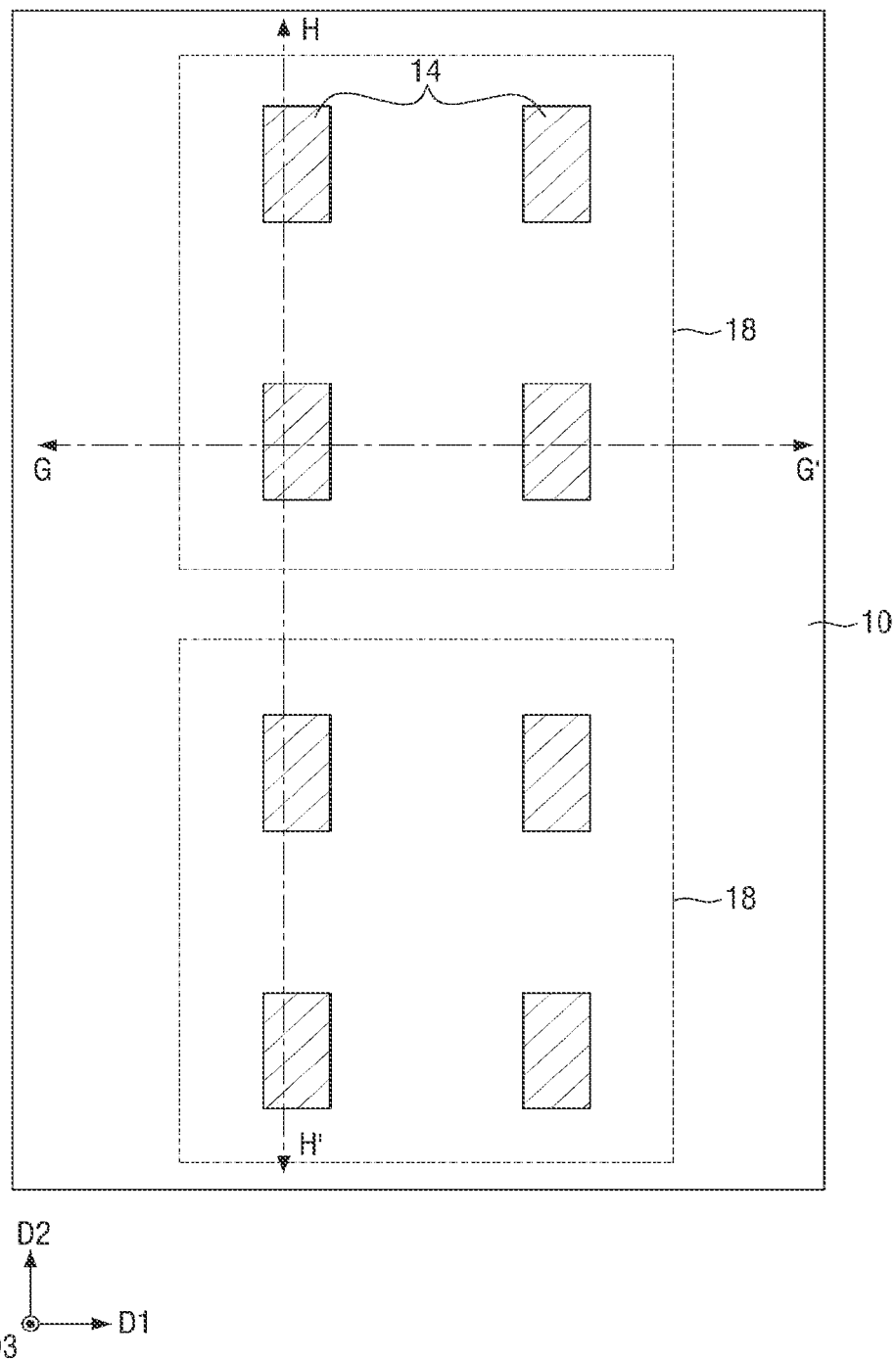
Figure 15:
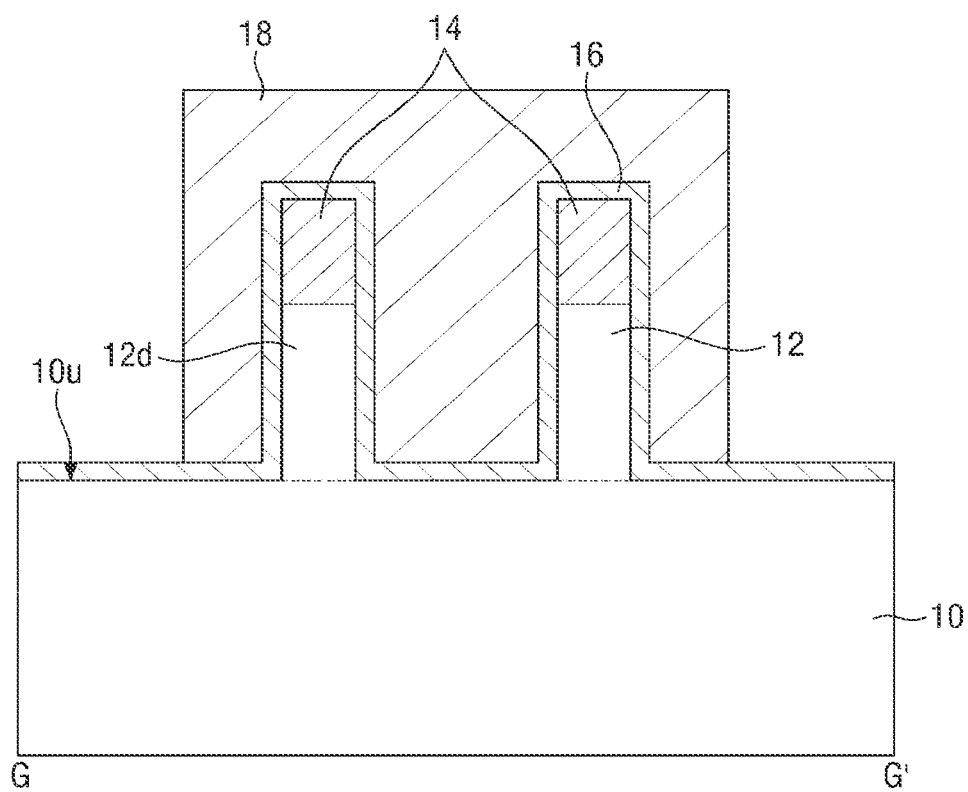
Figure 15:
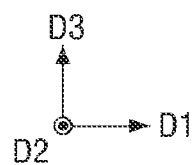
Figure 16:
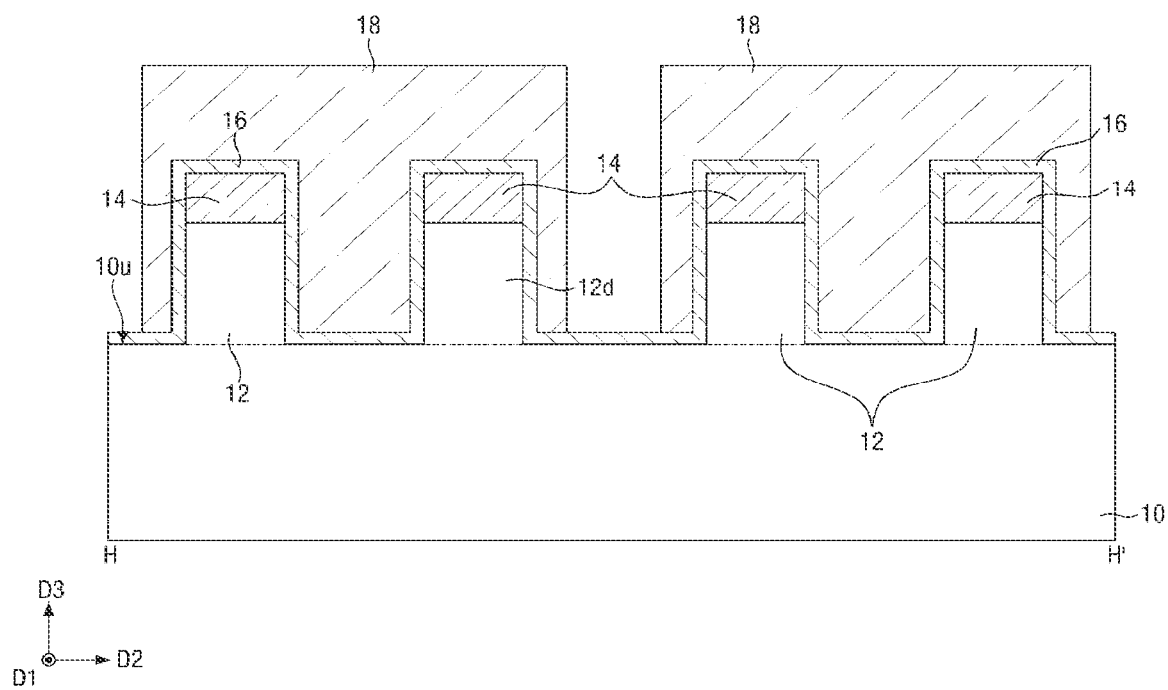

Referring to FIG. 10 and FIGS. 14 through 19, forming the channel regions and the active region (Block 100 in FIG. 9) may further include forming active mask layers 18 on the substrate 10 and forming a first active region 22_1 and a second active region 22_2 by etching the substrate 10 using the active mask layers 18 as an etch mask (Block 140). For example, the active mask layers 18 may be a photo resist layer. To show the mask layers 14, FIG. 14 does not show the liner 16, and FIG. 14 shows only outlines of the active mask layers 18.

Figure 17:
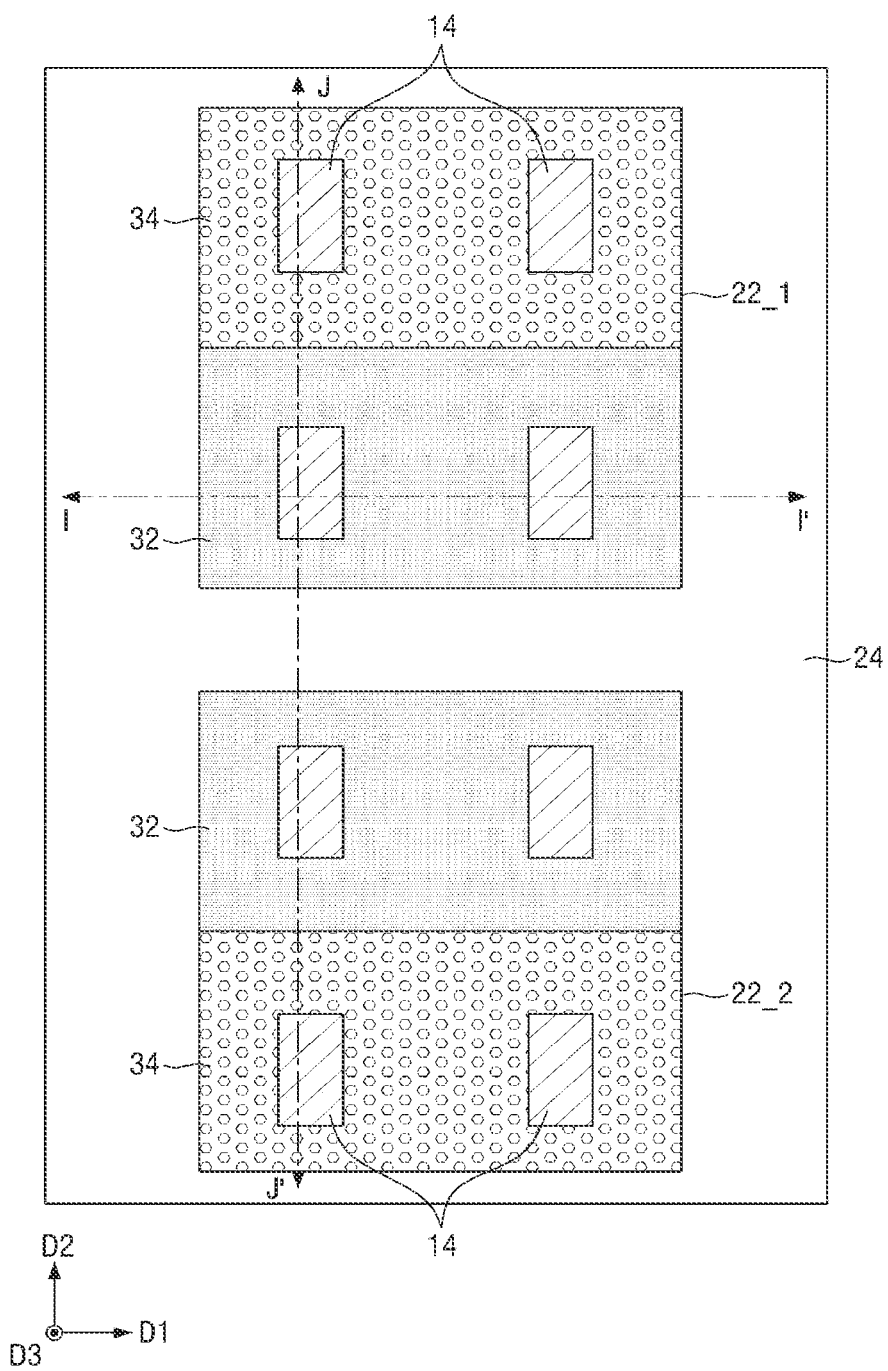

Referring to FIG. 17, four channel regions 12 may be formed adjacent to four corners of each of the first active region 22_1 and the second active region 22_2, and thus the four corners of each of the first active region 22_1 and the second active region 22_2 may have the same or similar shape in a plan view. Although FIG. 17 shows that the four corners of each of the first active region 22_1 and the second active region 22_2 have a right angle, in some embodiments, these four corners may be rounded corners. Even when those four corners are rounded corners, the four corners may have the same or similar shape.

Figure 18:
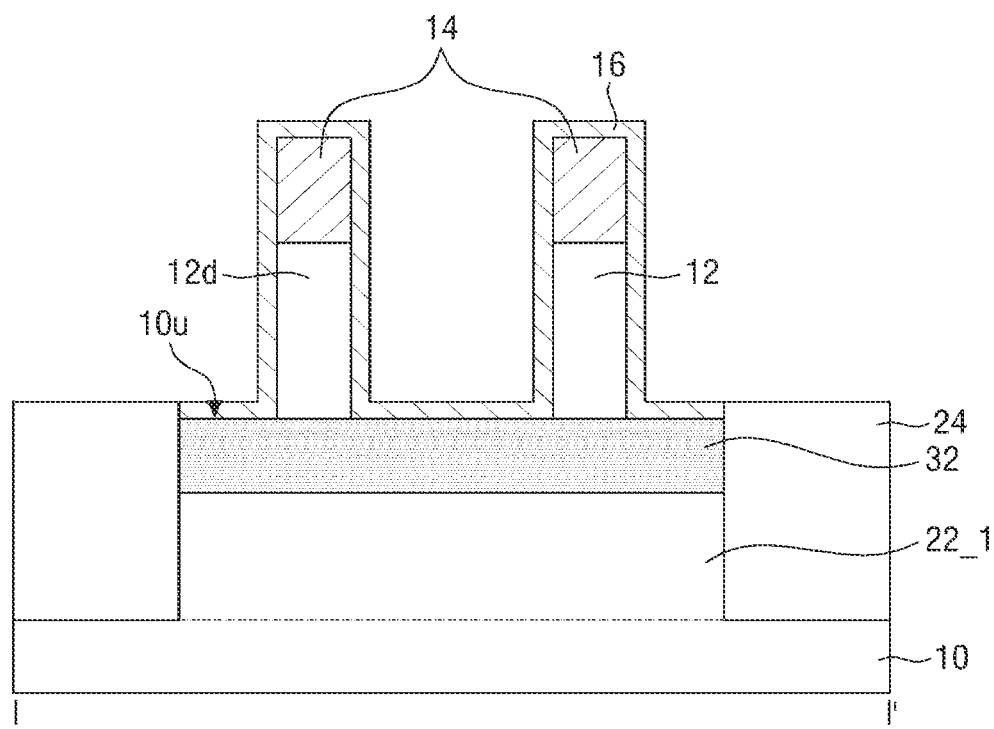
Figure 19:
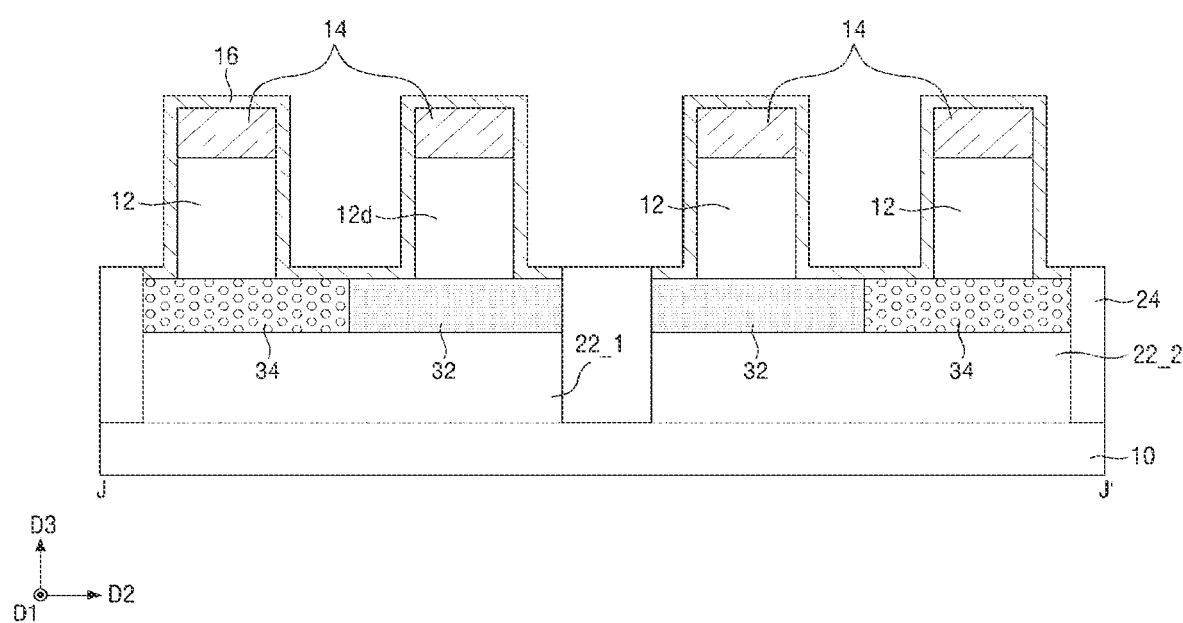

Referring to FIGS. 17 through 19, a field isolation layer 24 may be formed on side surfaces of the first active region 22_1 and the second active region 22_2, and a first bottom source/drain region 32 having a first conductivity type (e.g., P-type) and a second bottom source/drain region 34 having a second conductivity type (e.g., N-type) may be formed on each of the first active region 22_1 and the second active region 22_2. The mask layers 14 and the liner 16 may be removed after the first active region 22_1 and the second active region 22_2 are formed. The first bottom source/drain region 32 may include a first conductivity type impurity element (e.g., B, Al, and/Ga), and the second bottom source/drain region 34 may include a second conductivity type impurity element (e.g., P and/or As).

Figure 20:
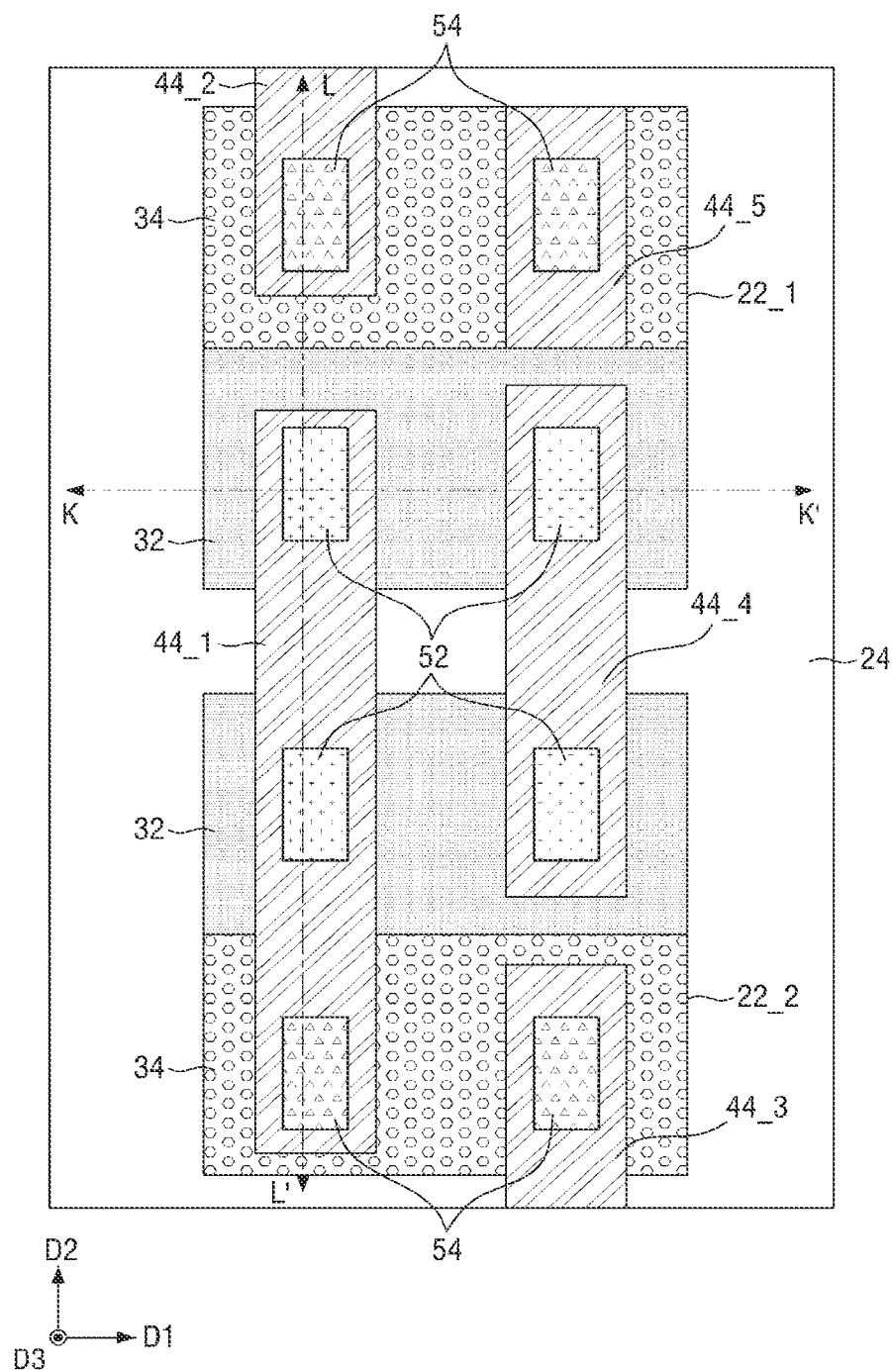

Referring to FIG. 9 and FIGS. 20 through 22, forming the gate electrode and the spacers (Block 200 in FIG. 9) may include forming gate electrodes 44_1, 44_2, 44_3, 44_4, or 44_5 and spacers 48 on side surfaces of the channel region 12. For simplicity of illustration, FIG. 20 shows some elements, not all elements, shown in FIGS. 21 and 22. For example, the spacers 48 are not shown in FIG. 20.

Figure 21:
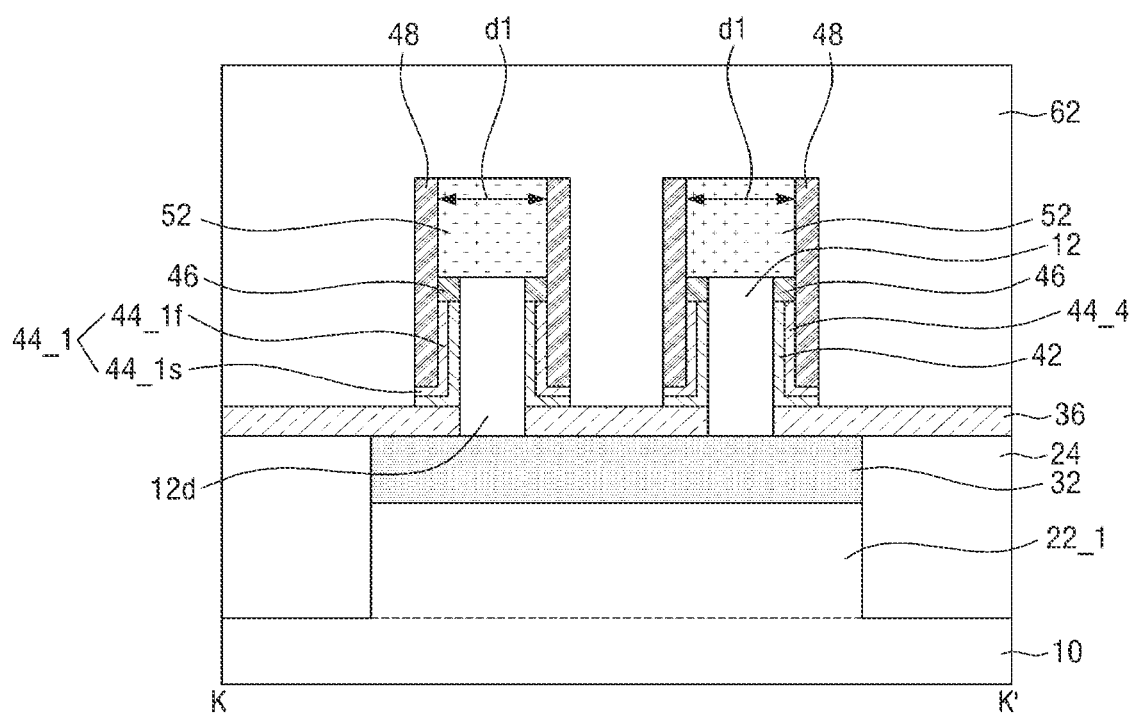
Figure 21:
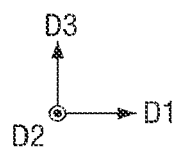
Figure 22:
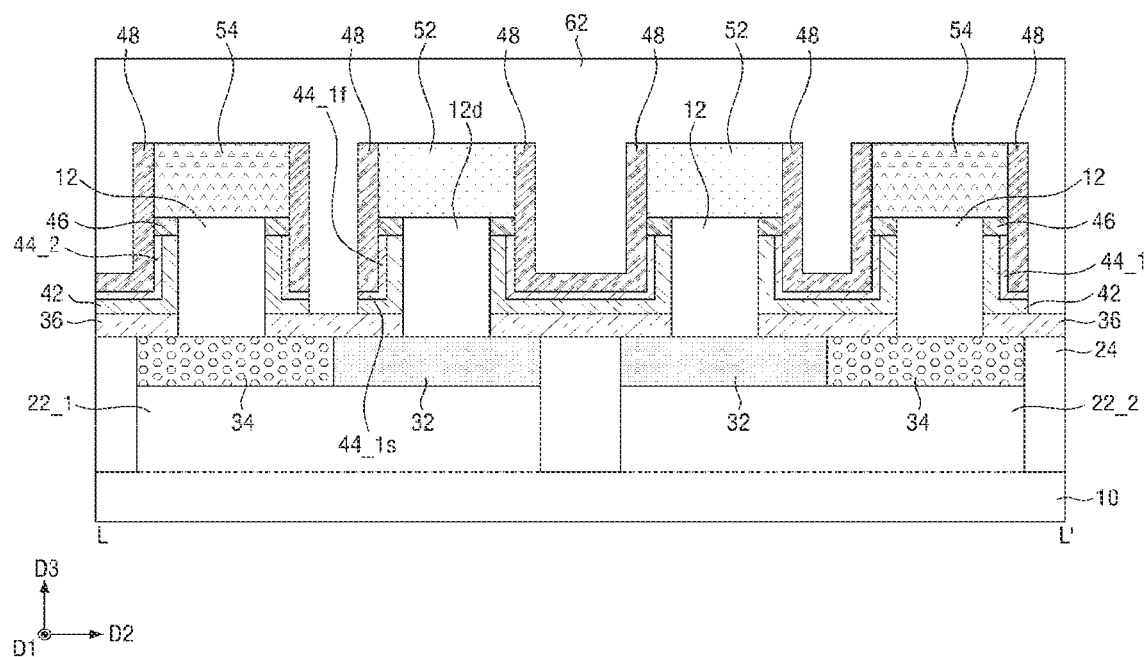

The spacers 48 may include, for example, an insulating material that has an etch selectivity with respect to an insulating layer (e.g., 62 in FIGS. 21 and 22). For example, the spacers 48 may include a SiN layer and/or SiON layer. In some embodiments, the spacers 48 may be a SiN layer. One pair of spacers 48 on side surface of a single channel region 12 may be spaced apart from each other by a first distance d1 in the first horizontal direction D1 as illustrated in FIG. 21.

Referring to FIGS. 1 and 20 through 22, the gate electrodes 44_1, 44_2, 44_3, 44_4, and 44_5 may include a first gate electrode 44_1 shared by the second pull up transistor PUL and the second pull down transistor PDL, and a first portion 44_1f of the first gate electrode 44_1 may be formed on a side surface of the dummy channel region 12d. The first gate electrode 44_1 may also include a second portion 44_1s between the spacer 48 and the first bottom source/drain region 32. The first gate electrode 44_1 may extend from the first active region 22_1 onto the second active region 22_2 as illustrated in FIG. 20 and may be or may include a monolithic conductive layer.

Referring to FIGS. 21 and 22, the method may also include forming a gate insulator 42 between the gate electrodes 44_1, 44_2, 44_3, 44_4, or 44_5 and the channel region 12 and forming a bottom spacer 36 that separates the first bottom source/drain region 32 and the second bottom source/drain region 34 from the gate electrodes 44_1, 44_2, 44_3, 44_4, or 44_5.

In some embodiments, the gate insulator 42 may include, for example, silicon oxide and/or a high-k material (e.g., hafnium oxide or aluminum oxide). In some embodiments, the gate electrodes 44_1, 44_2, 44_3, 44_4, or 44_5 may include a metallic layer (e.g., W, Ti, Cu, and/or Co). In some embodiments, the gate electrodes 44_1, 44_2, 44_3, 44_4, or 44_5 may also include a work function layer that may include metal nitride (e.g., TiN, TiAl, TiAlN, TaAlN), TaC, TiC, or HfSi.

The method may further include forming a first top source/drain region 52 and a second top source/drain region 54 and forming a top spacer 46 that is formed on the gate electrodes 44_1, 44_2, 44_3, 44_4, or 44_5 and separates the gate electrodes 44_1, 44_2, 44_3, 44_4, or 44_5 from the first top source/drain region 52 or the second top source/drain region 54. The first top source/drain region 52 may include a first conductivity type impurity element (e.g., B, Al, and/Ga) therein and thus may have the first conductivity type. The second top source/drain region 54 may include a second conductivity type impurity element (e.g., P and/or As) and thus may have the second conductivity type.

Each of the first top source/drain region 52 and the second top source/drain region 54 may be formed by performing an epitaxial growth process using the channel regions 12 as a seed layer and may include a semiconductor material. In some embodiments, each of the first top source/drain region 52 and the second top source/drain region 54 may contact spacers 48 as illustrated in FIGS. 21 and 22.

For example, each of the bottom spacer 36 and the top spacer 46 may include an insulating material (e.g., silicon oxide, silicon nitride and/or silicon oxynitride). In some embodiments, the bottom spacer 36 and the top spacer 46 may include different materials.

An insulating layer 62 may be formed on the first top source/drain region 52 and the second top source/drain region 54. The insulating layer 62 may include an insulating material (e.g., a silicon layer including oxygen and/or nitride or a low dielectric layer having a dielectric constant lower than silicon dioxide).

Figure 23:
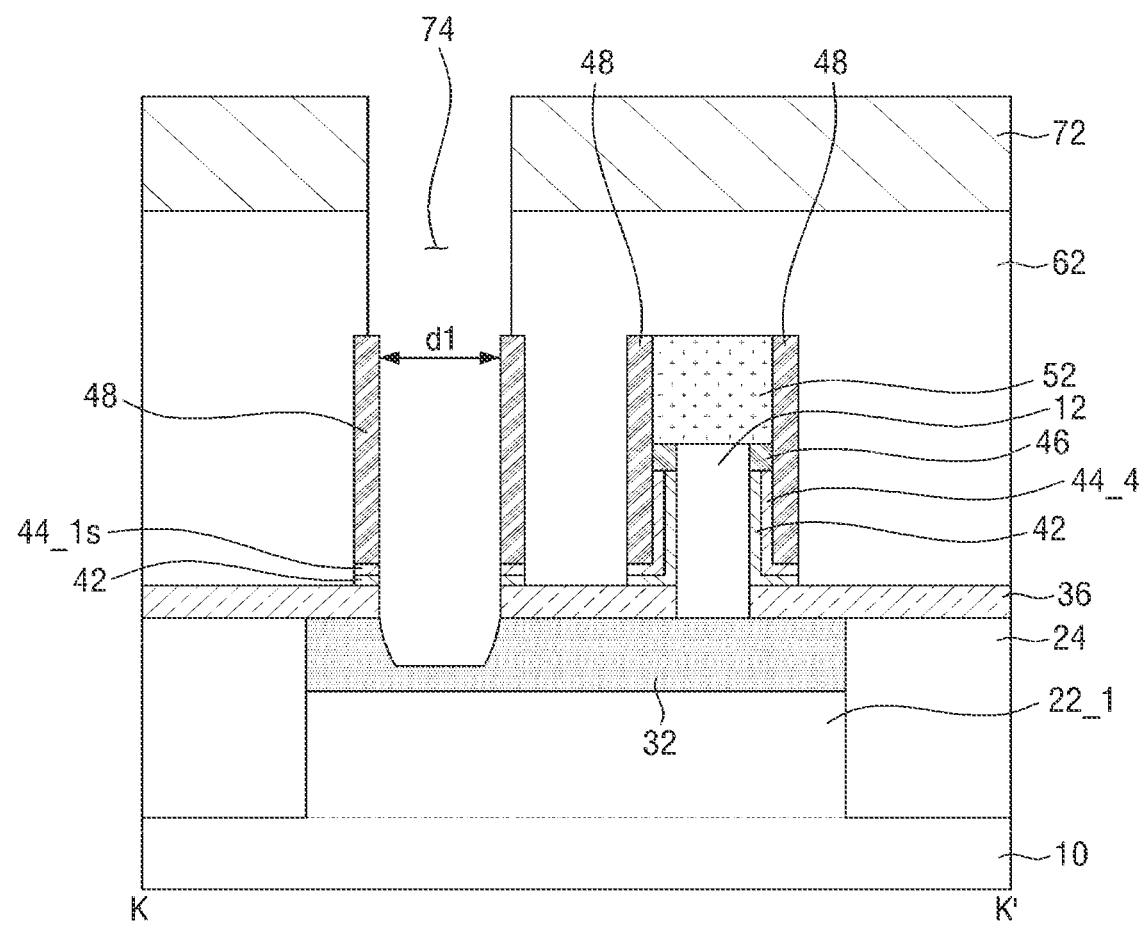
Figure 24:
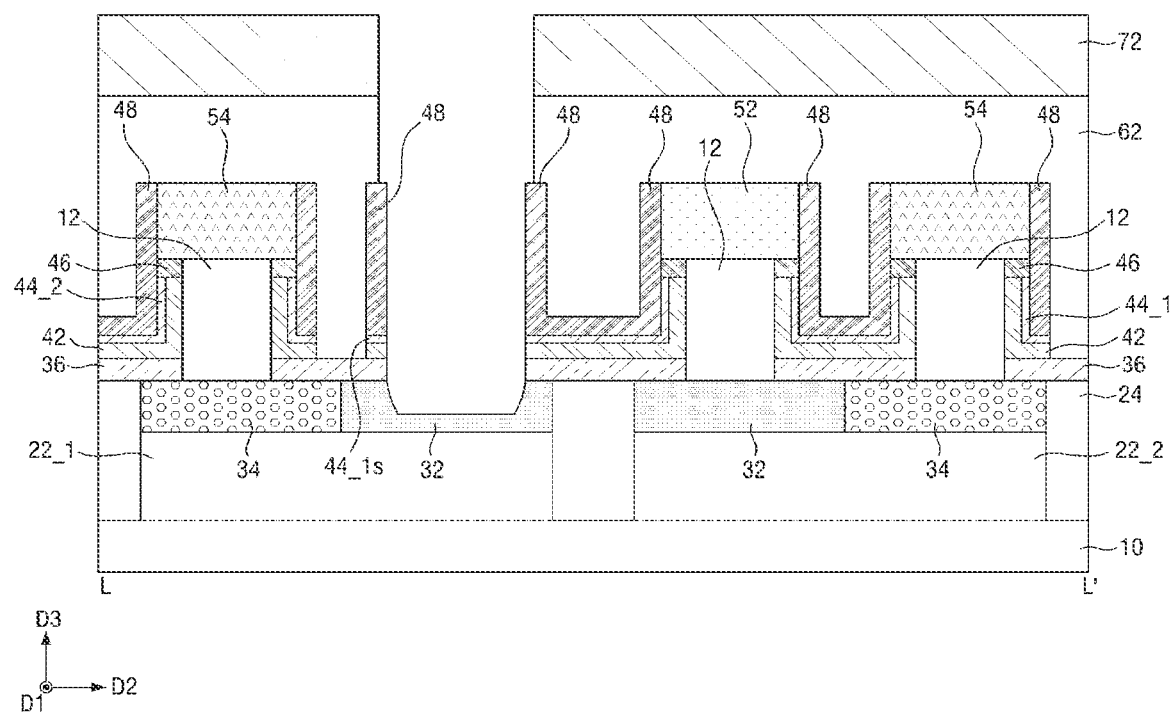

Referring to FIGS. 23 and 24, a second mask layer 72 may be formed on the insulating layer 62, and a first opening 74 may be formed by removing a portion of the insulating layer 62, the first top source/drain region 52 on the dummy channel region 12d, the top spacer 46 adjacent to the dummy channel region 12d, the dummy channel region 12d, the first portion 44_1f of the first gate electrode 44_1, and the gate insulator 42 between the first portion 44_1f of the first gate electrode 44_1 and the dummy channel region 12d using the second mask layer 72 as an etch mask. In some embodiments, a portion of the first bottom source/drain region 32 may be removed to form the first opening 74.

In some embodiments, the first opening 74 may expose side surfaces of the spacers 48 between which the dummy channel region 12d was placed. In some embodiments, the first opening 74 may expose the entire side surfaces of the spacers 48 between which the dummy channel region 12d was placed as illustrated in FIGS. 23 and 24. In some embodiments, the first opening 74 may also expose a side surface of the second portion 44_1s of the first gate electrode 44_1. In some embodiments, a side surface of the spacer 48 and the side surface of the second portion 44_1s of the first gate electrode 44_1 exposed by the first opening 74 may be vertically aligned with each other as illustrated in FIGS. 23 and 24.

In some embodiments, the spacers 48 may include a material having an etch selectivity with respect to the insulating layer 62, and thus the first opening 74 and a bottom source/drain contact (e.g., 82 in FIG. 27) may be self-aligned between the spacers 48 even if the second mask layer 72 is misaligned.

Figure 25:
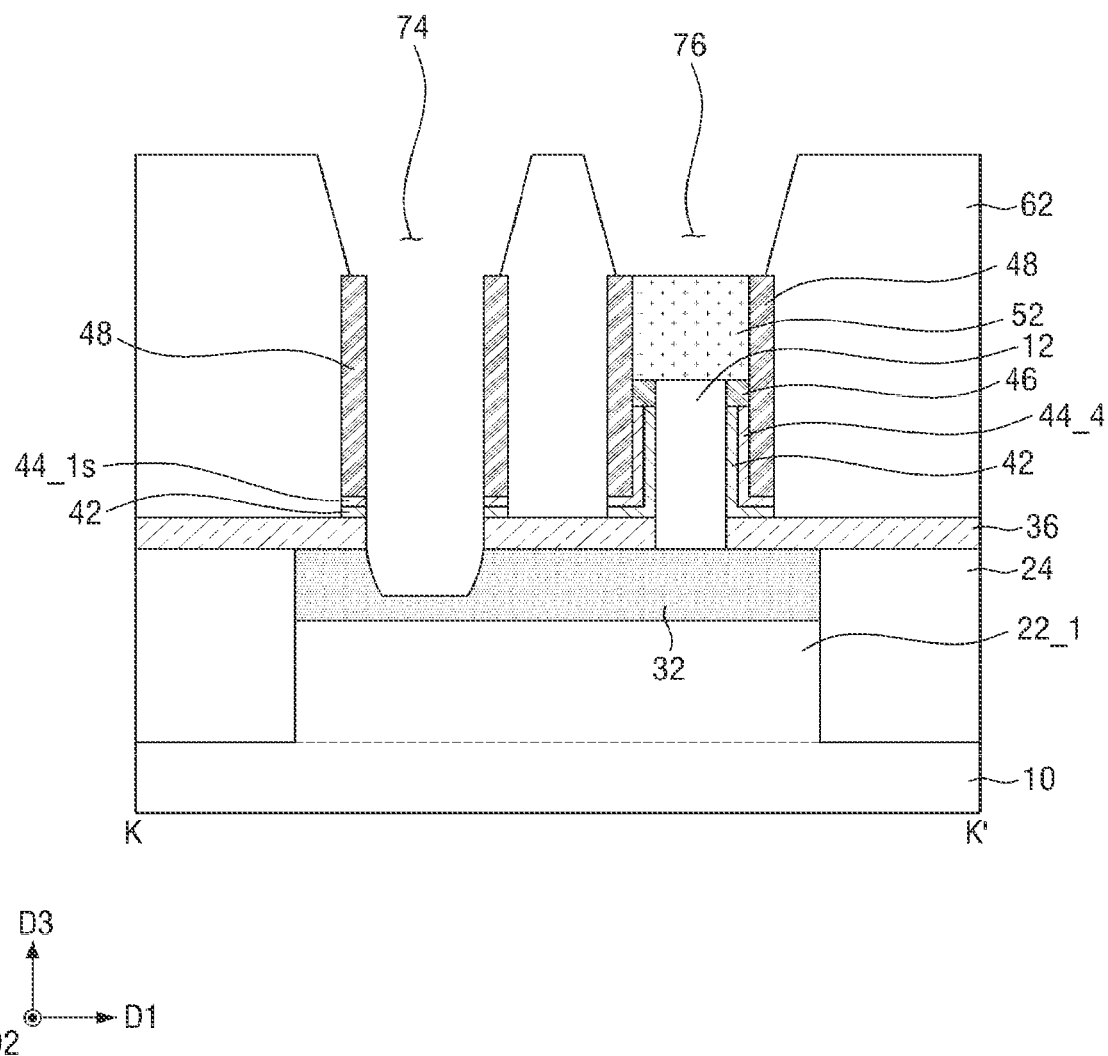
Figure 26:
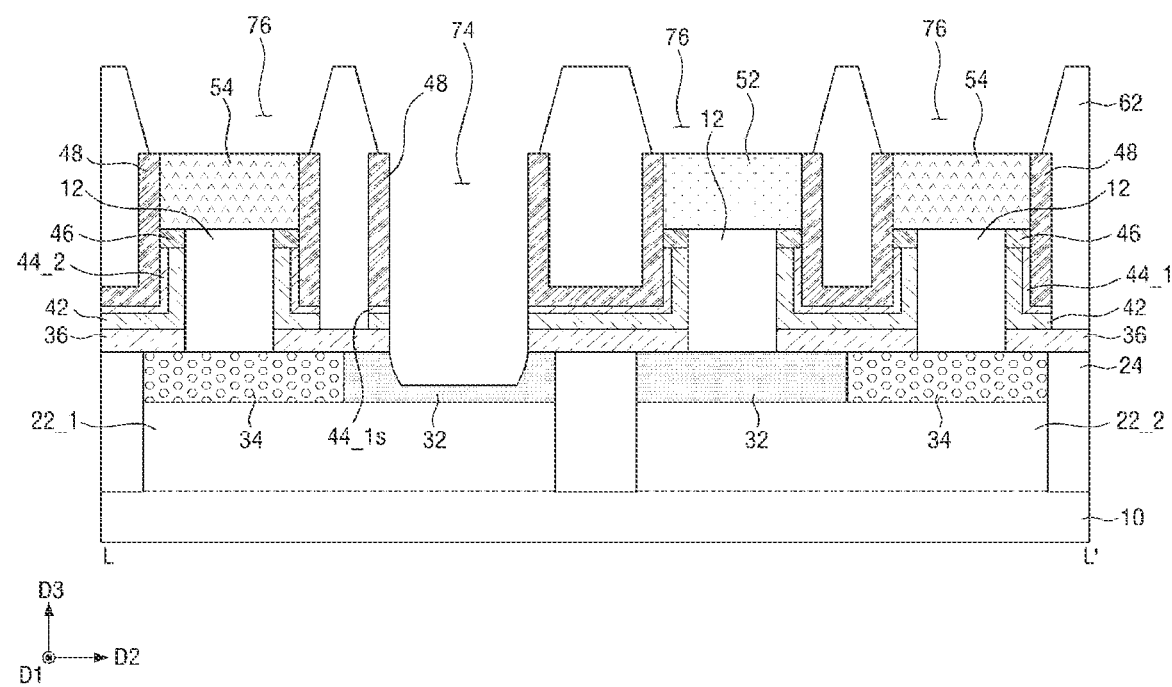

Referring to FIGS. 25 and 26, a second opening 76 exposing the first top source/drain region 52 or the second top source/drain region 54 may be formed in the insulating layer 62.

Figure 27:
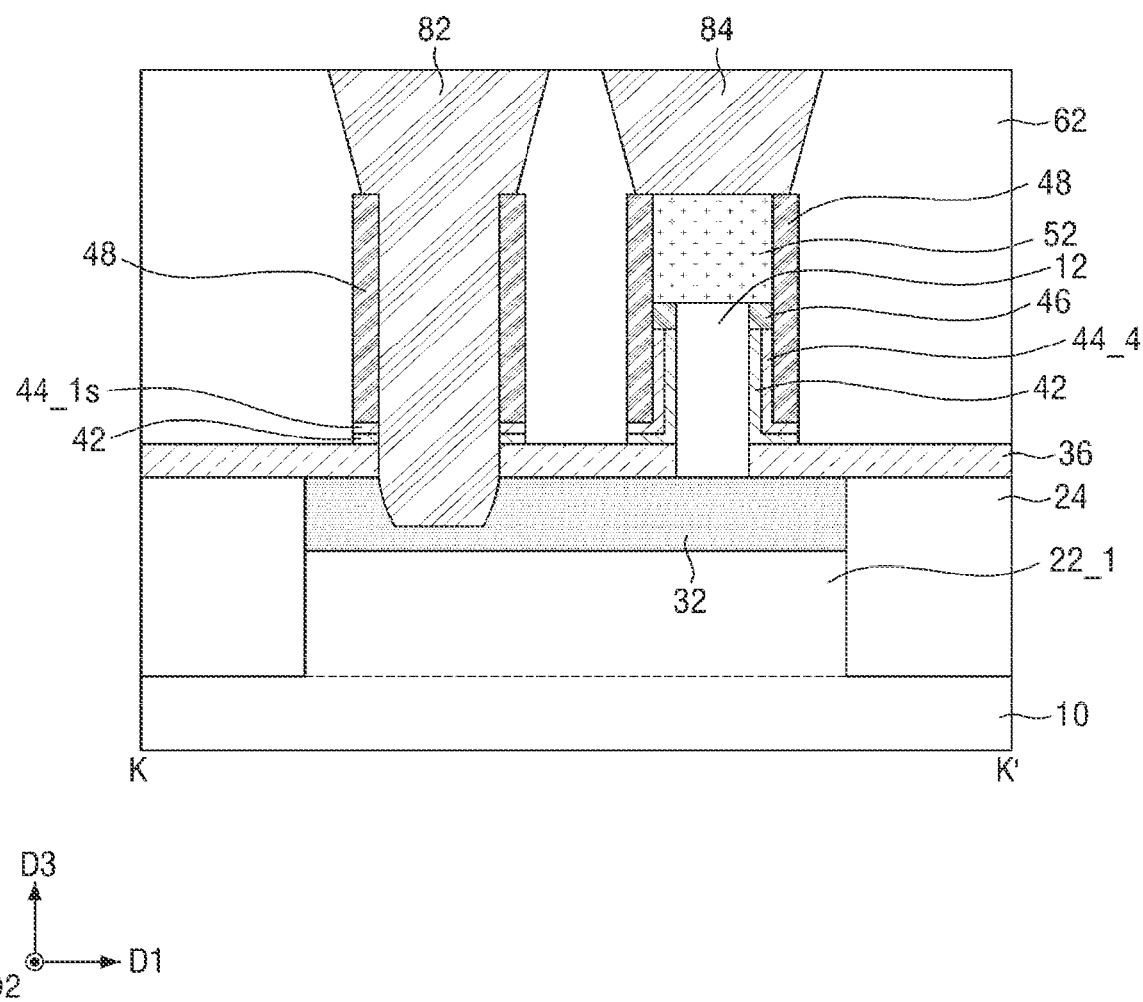
Figure 28:
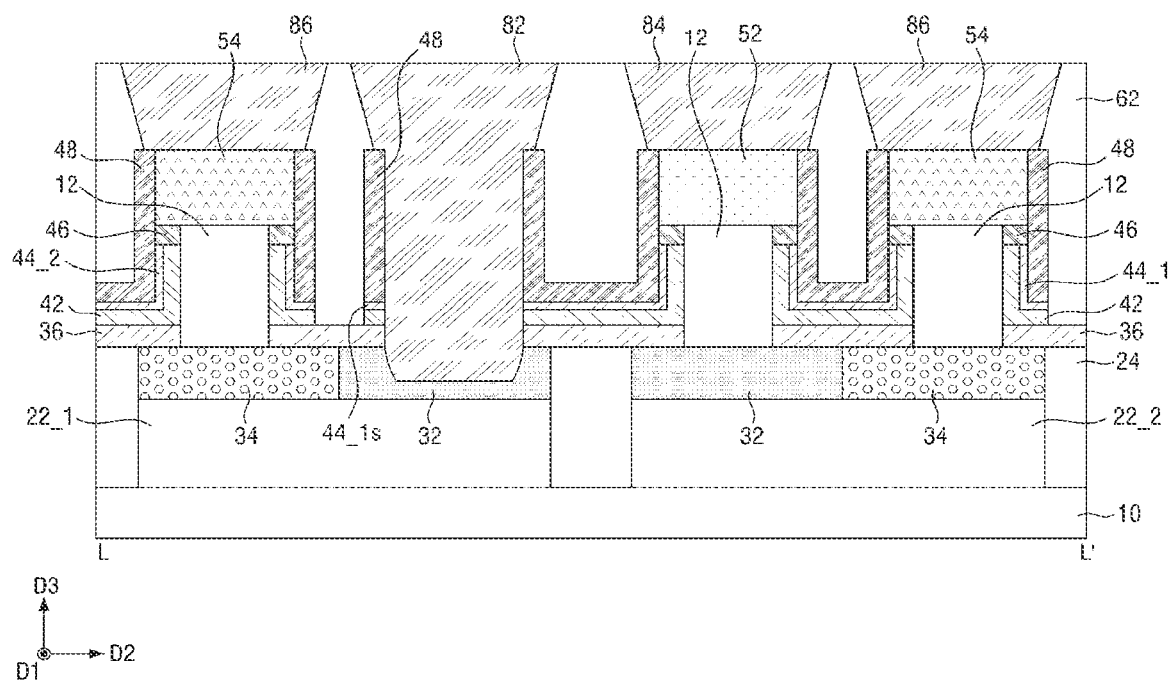

Referring to FIGS. 27 and 28, a bottom source/drain contact 82, a first contact 84, and a second contact 86 may be formed by forming a conductive layer in the first opening 74 and the second openings 76. The first contact 84 may contact the first top source/drain region 52, and the second contact 86 may contact the second top source/drain region 54. In some embodiments, upper surfaces of the bottom source/drain contact 82, the first contact 84, and the second contact 86 may be coplanar with each other.

The bottom source/drain contact 82 may contact the second portion 44_1s of the first gate electrode 44_1 and the first bottom source/drain region 32 and thus may electrically connect the second portion 44_1s of the first gate electrode 44_1 to the first bottom source/drain region 32. Accordingly, the bottom source/drain contact 82 may be a portion of the node contact QB in FIGS. 1 and 2, and the first gate electrode 44_1 shared by the second pull up transistor PUL and the second pull down transistor PDL may be electrically connected to the first bottom source/drain region 32 through the bottom source/drain contact 82. A bottom source/drain contact of the node contact Q in FIGS. 1 and 2 may be formed to have a structure the same as or similar to that of the bottom source/drain contact 82 in FIGS. 27 and 28.

In some embodiments, the bottom source/drain contact 82 may be formed to fill the first opening 74 and may contact side surfaces of the spacers 48 as illustrated in FIGS. 27 and 28.

Referring to FIGS. 29 and 30, in some embodiments, an upper portion of the bottom source/drain contact 82 may be removed such that an upper surface of the bottom source/drain contact 82 may be recessed toward the substrate 10 with respect to upper surfaces of the spacers 48 between which the bottom source/drain contact 82 is formed. Accordingly, the upper surface of the bottom source/drain contact 82 may be closer to the substrate 10 than the upper surfaces of the spacers 48.

Figure 31:
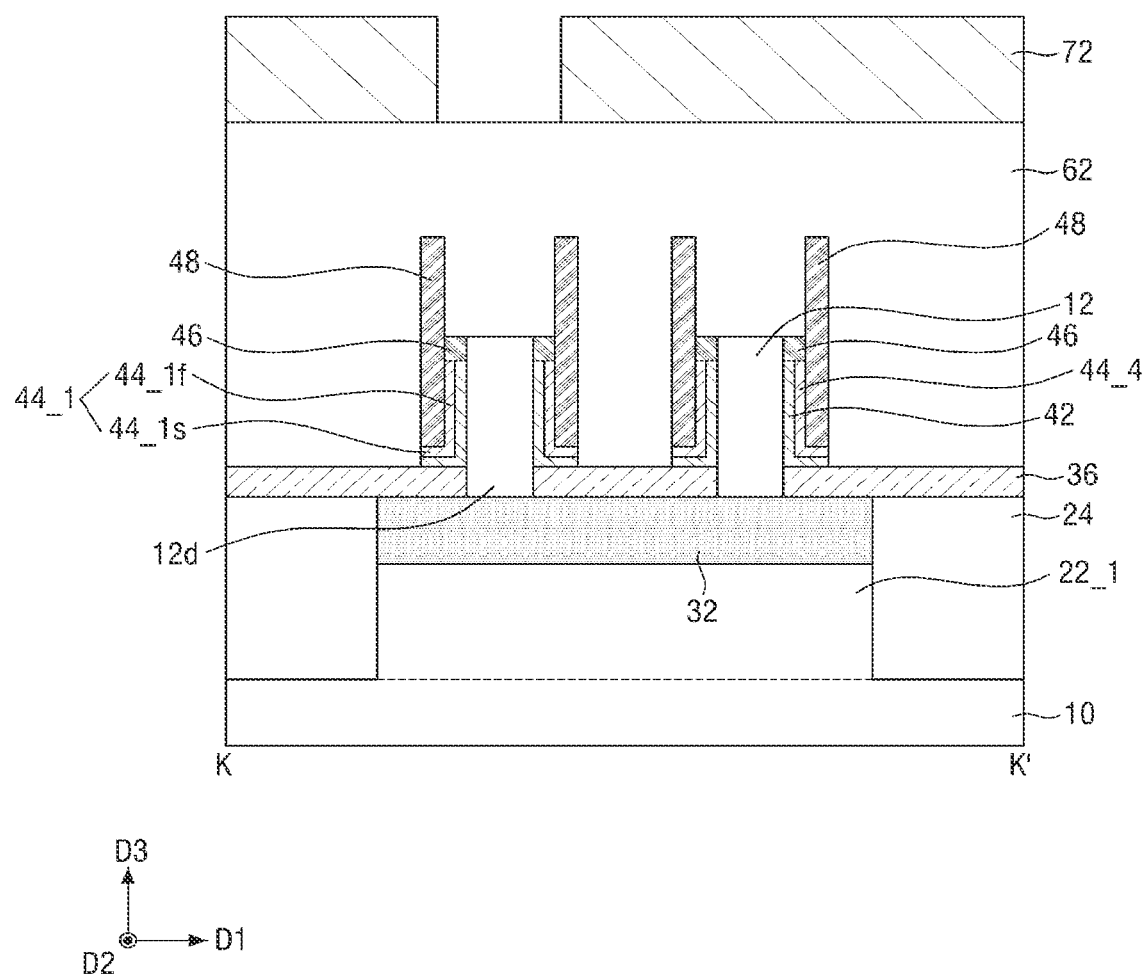
FIGS. 31 through 36 are cross-sectional views illustrating a method of forming the 6T SRAM illustrated in FIGS. 1 and 2.
Figure 32:
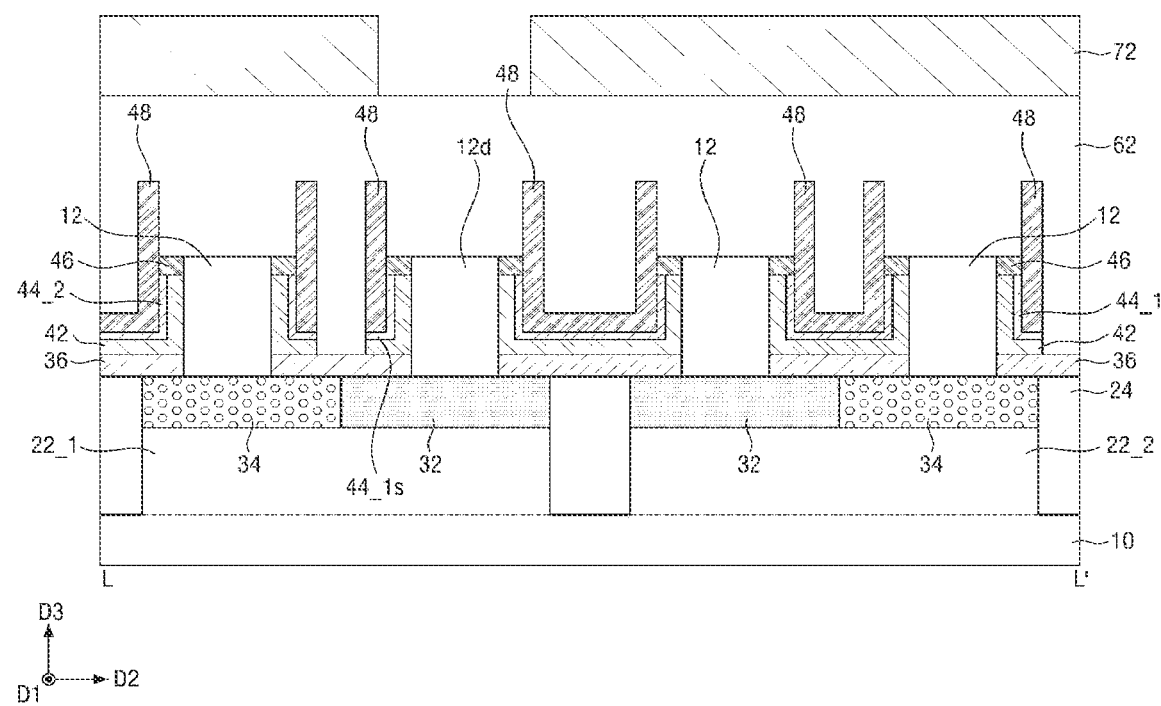

An intermediate structure shown in FIGS. 31 and 32 may be formed through processes the same as or similar to those described with reference to FIGS. 3 through 19. Before forming top source/drain regions (e.g., 52 and 54 in FIGS. 21 and 22), an insulating layer 62 and a second mask layer 72 may be formed on a substrate 10. The second mask layer 72 may expose a portion of the insulating layer 62 as illustrated in FIGS. 31 and 32.

Figure 33:
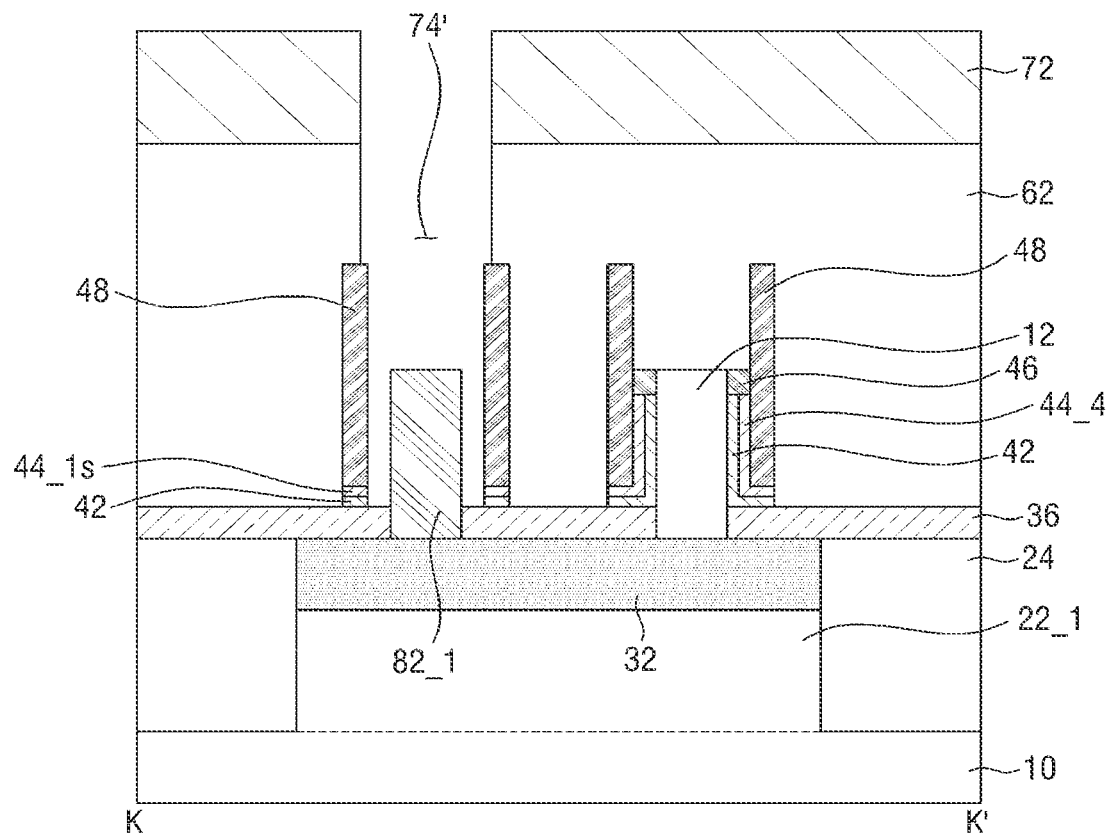
Figure 34:
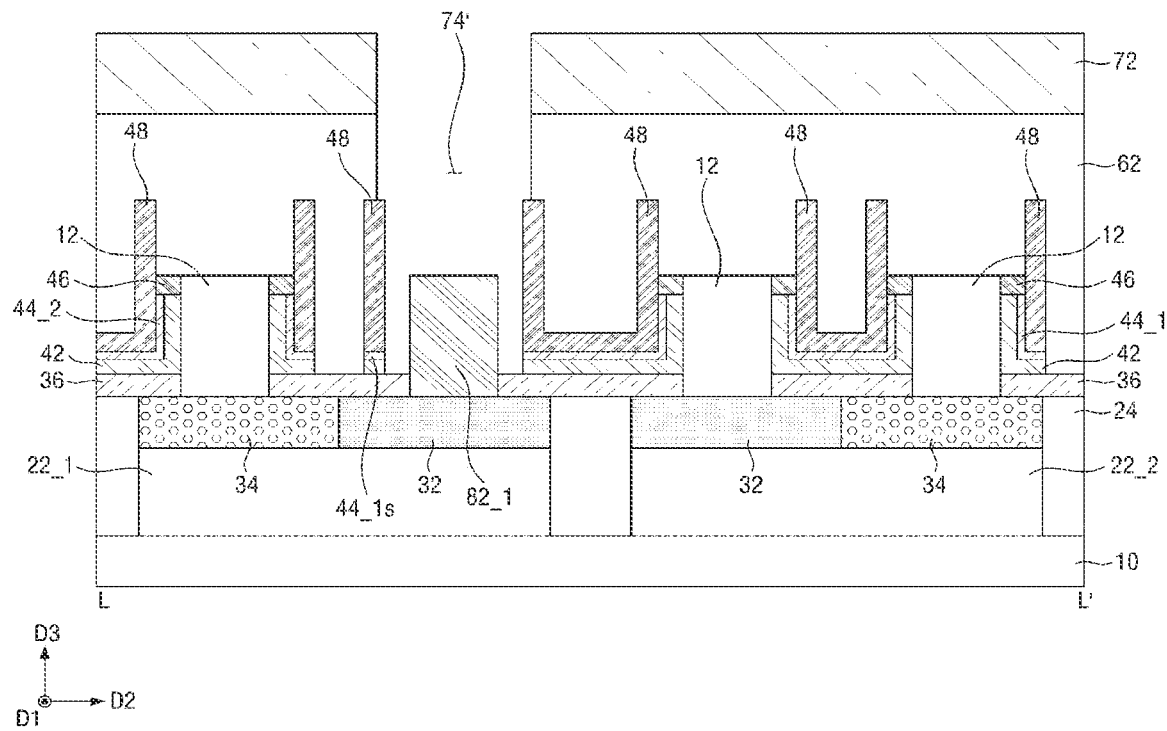

Referring to FIGS. 33 and 34, a portion of the insulating layer 62, the top spacer 46, the first portion 44_1f of the first gate electrode 44_1, and a portion of the gate insulator 42 may be removed to form a first contact opening 74' that exposes the dummy channel region 12d and a portion of the bottom spacer 36. A first conductivity type impurity element may be added to the dummy channel region 12d by, for example, an ion implantation process, to convert the dummy channel region 12d to a first portion 82_1 of a bottom source/drain contact 82.

Figure 35:
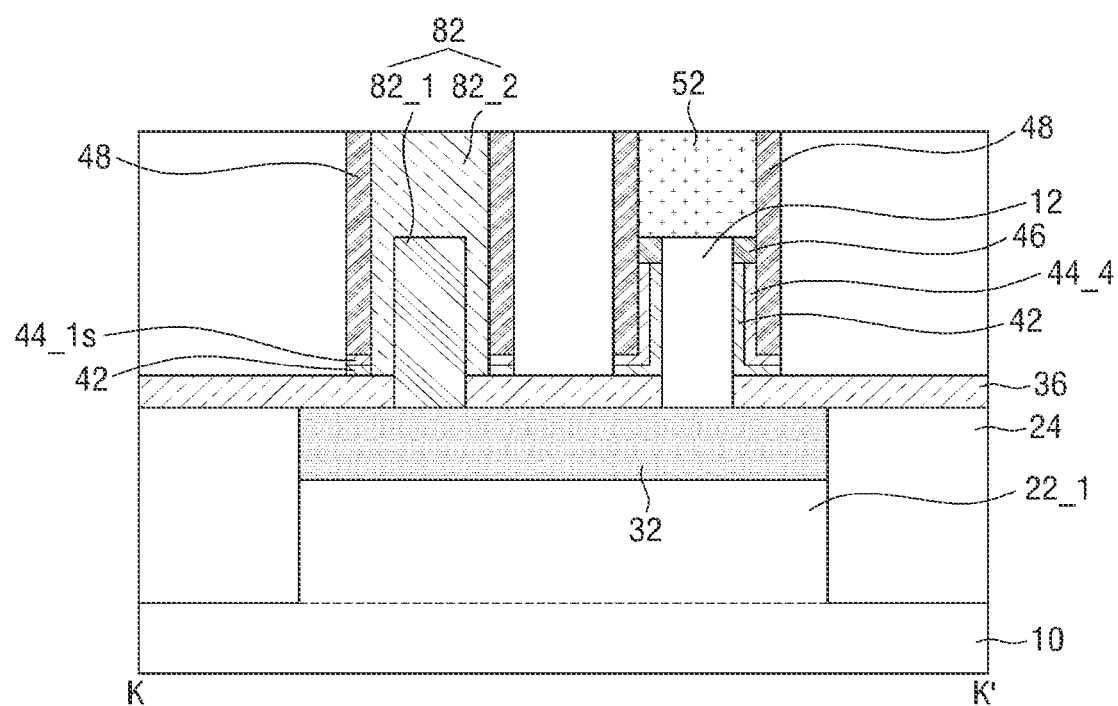
Figure 35:
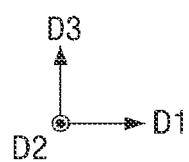
Figure 36:
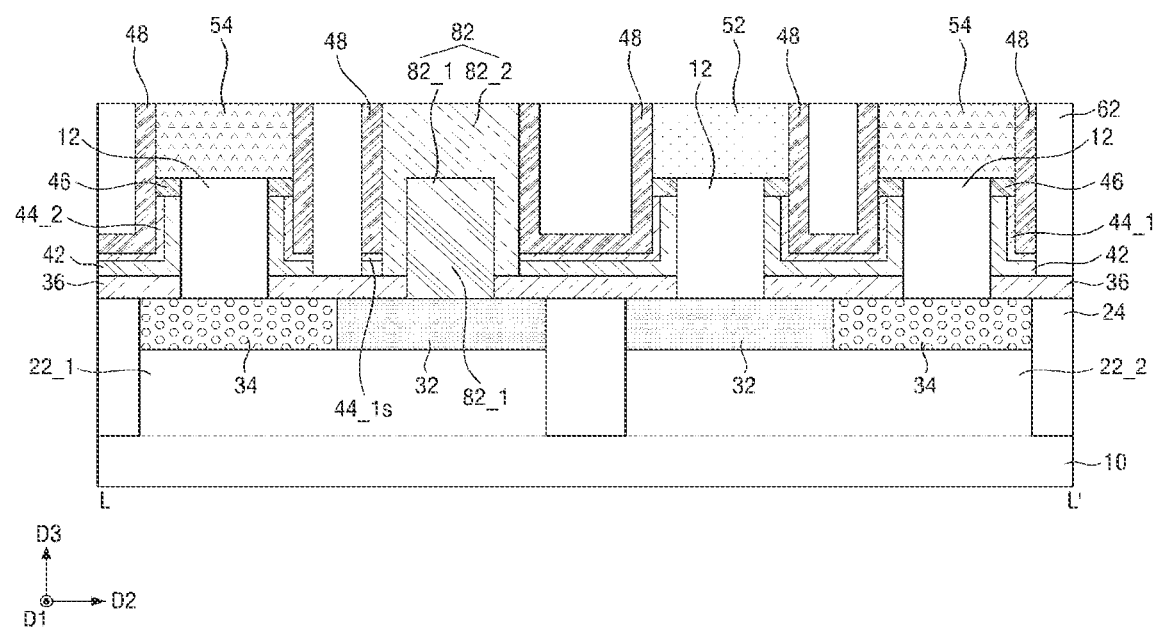

Referring to FIGS. 35 and 36, a second portion 82_2 of the bottom source/drain contact 82 may be formed in the first contact opening 74' while forming a first top source/drain region 52 and/or a second top source/drain region 54. An epitaxial growth process may performed to form the second portion 82_2 of the bottom source/drain contact 82, the first top source/drain region 52 and the second top source/drain region 54. The second portion 82_2 of the bottom source/drain contact 82 may be grown using the first portion 82_1 of the bottom source/drain contact 82 as a seed layer, and each of the first top source/drain region 52 and the second top source/drain region 54 may be grown using the channel region 12 as a seed layer.

In some embodiments, upper surfaces of the bottom source/drain contact 82, the first top source/drain region 52, and the second top source/drain region 54 may be coplanar with each other as illustrated in FIGS. 35 and 36. Further, the upper surfaces of the bottom source/drain contact 82, the first top source/drain region 52, and the second top source/drain region 54 may be coplanar with upper surfaces of the spacers 48 as illustrated in FIGS. 35 and 36. In some embodiments, a bottom source/drain contact 82, a first contact 84, and a second contact 86 in FIGS. 27 and 28 may be formed on the intermediate structure shown in FIGS. 35 and 36.

Figure 37:
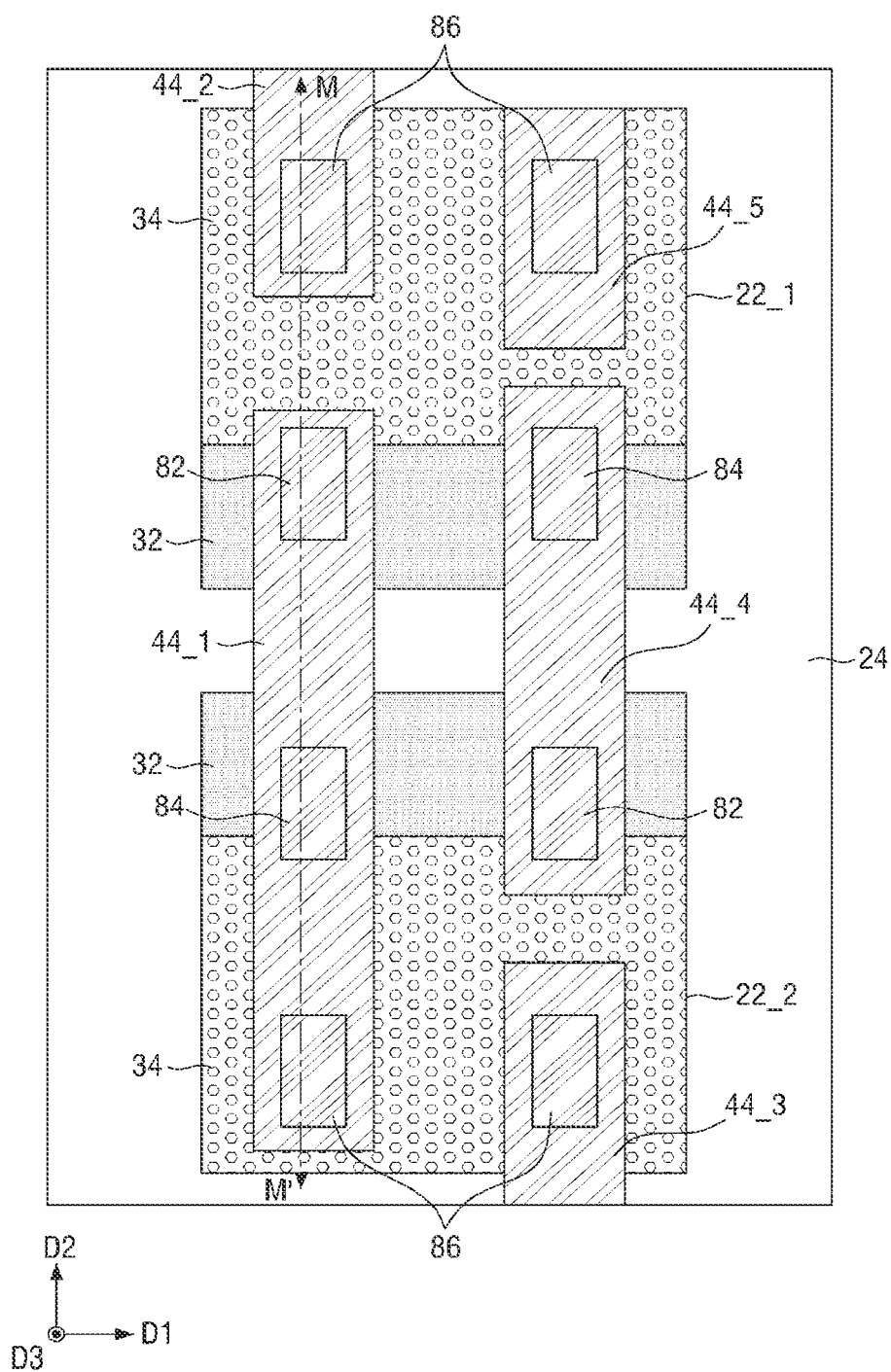
FIGS. 37 through 39 are views illustrating a method of forming the 6T SRAM illustrated in FIGS. 1 and 2.
Figure 38:
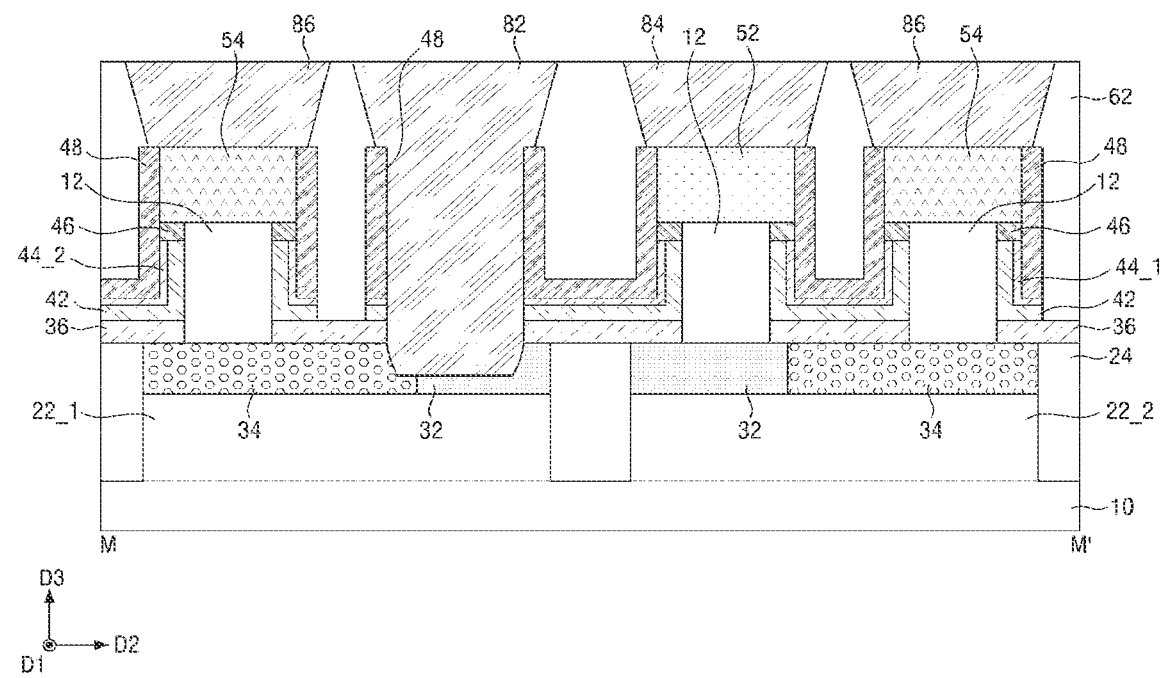

A 6T SRAM shown in FIGS. 37 through 39 may be formed by processes the same as or similar to those described with reference FIGS. 3 through 30. Referring to FIGS. 37 and 38, the second bottom source/drain region 34 may have a length in the second horizontal direction D2 longer than a length of the second bottom source/drain region 34 in FIG. 17, and a bottom source/drain contact 82 may overlap and contact a portion of the second bottom source/drain region 34.

Figure 39:
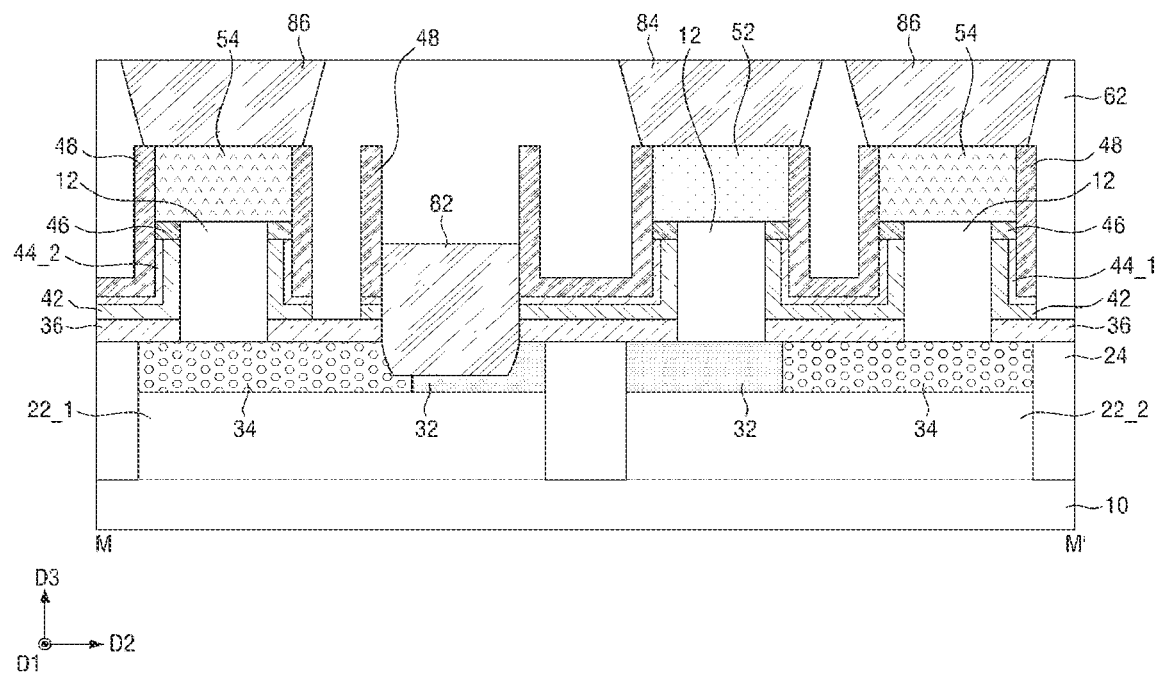

Referring to FIG. 39, an upper portion of the bottom source/drain contact 82 may be removed such that an upper surface of the bottom source/drain contact 82 may be recessed toward the substrate 10 with respect to upper surfaces of spacers 48. Accordingly, the upper surface of the bottom source/drain contact 82 may be closer to the substrate 10 than the upper surfaces of spacers 48.

Figure 40:
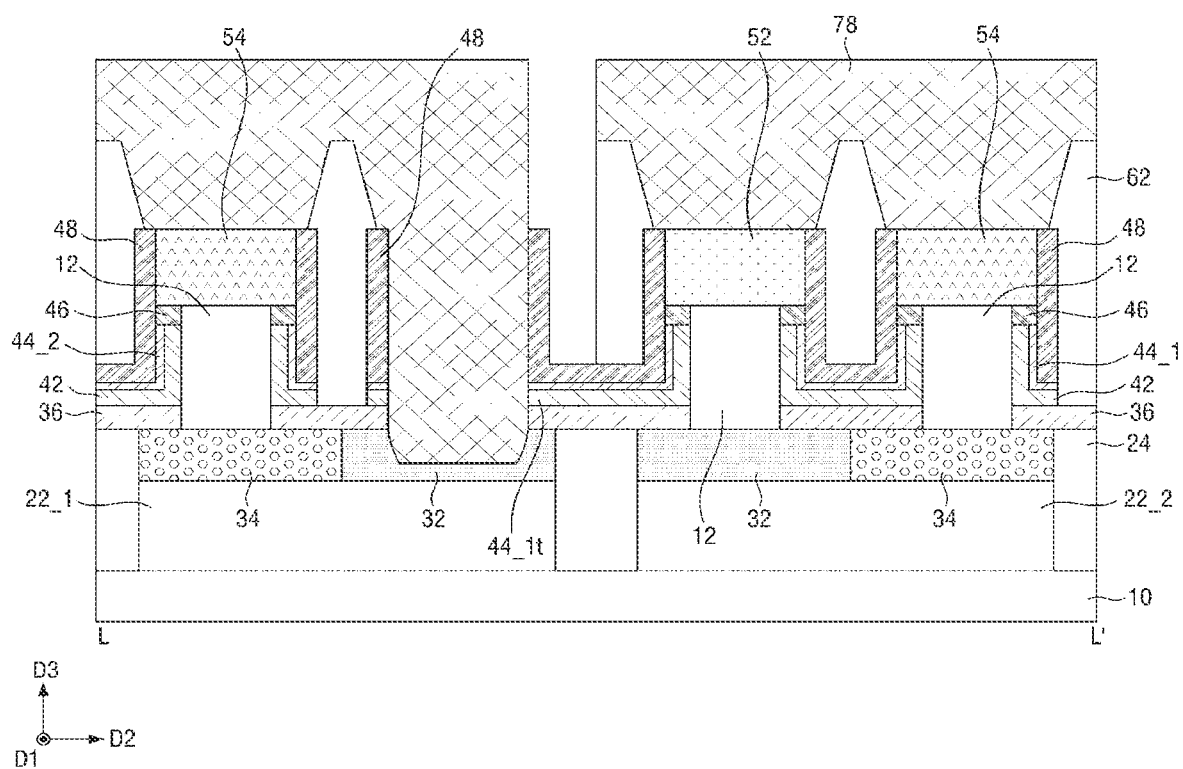
FIGS. 40 and 41 are cross-sectional views taken along the line L-L' of FIG. 20.

An intermediate structure shown in FIG. 40 may be formed by processes the same as or similar to those described with reference FIGS. 3 through 26 and then a third mask layer 78 may be formed thereon. The third mask layer 78 may expose a single spacer 48 to which a dummy channel region (e.g., 12d in FIG. 22) was adjacent.

Figure 41:
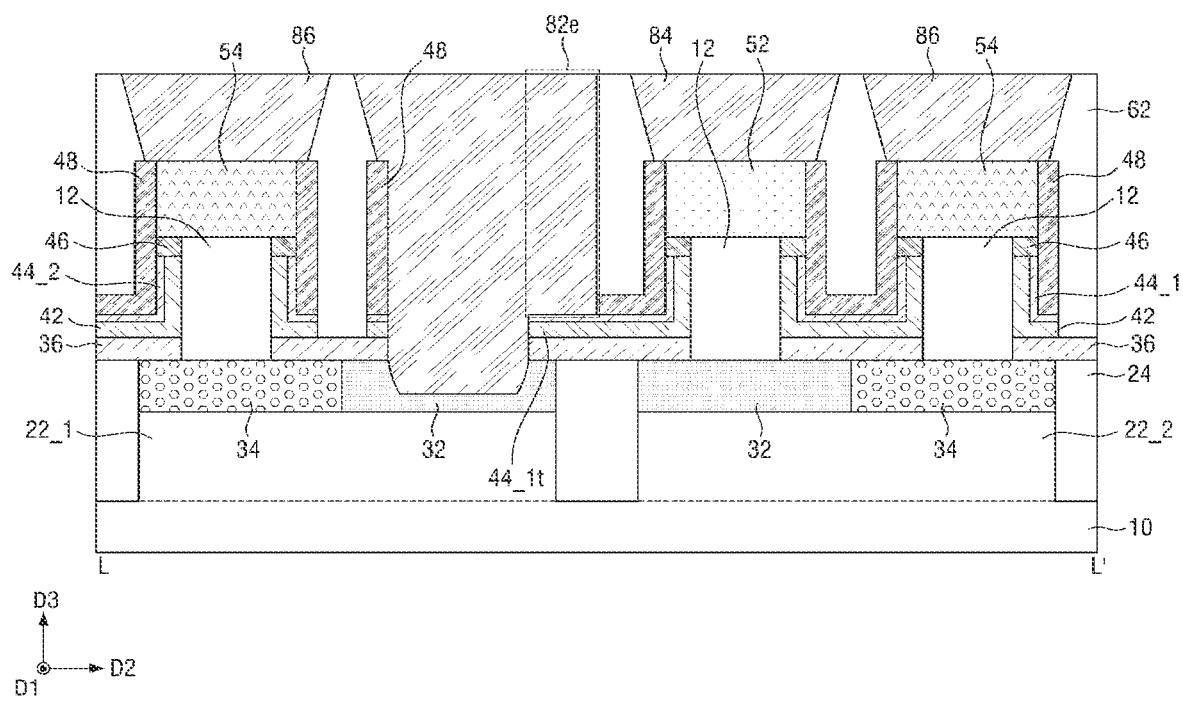

Referring to FIG. 41, the one of the spacers 48 may be removed until a third portion 44_1t of the first gate electrode 44_1 is exposed. After then, a conductive layer may be formed to form a bottom source/drain contact 82, an extended portion 82e of the bottom source/drain contact 82, the first contact 84, and the second contact 86. The extended portion 82e of the bottom source/drain contact 82 may improve an electrical connection between the bottom source/drain contact 82 and the first gate electrode 44_1 by contacting the third portion 44_1t of the first gate electrode 44_1.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that references herein to "an element A vertically overlapping an element B" (or similar language) means that a vertical line intersecting both the elements A and B exists. It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

It should be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
   a bottom source/drain region on an active region of a substrate;
   a plurality of spacers on the bottom source/drain region, wherein the plurality of spacers is spaced apart from each other and comprise a first spacer and a second spacer;
   a bottom spacer extending between the bottom source/drain region and the plurality of spacers;
   a gate electrode between the bottom spacer and the first spacer; and
   a bottom source/drain contact between the first spacer and the second spacer, wherein the bottom source/drain contact contacts both the first spacer and the second spacer and electrically connects the gate electrode to the bottom source/drain region.

2. The integrated circuit device of claim 1, wherein the plurality of spacers further comprises a third spacer and a fourth spacer, and the first, second, third, and fourth spacers are spaced apart from each other in a first horizontal direction,
   wherein the gate electrode comprises a first gate electrode, and
   wherein the integrated circuit device further comprises a vertical field-effect transistor (VFET) on the active region of the substrate, and the VFET comprises:
   a channel region between the third spacer and the fourth spacer, the channel region contacting the bottom source/drain region;
   a second gate electrode on a side surface of the channel region; and
   a top source/drain region on the second gate electrode between the third spacer and the fourth spacer.

3. The integrated circuit device of claim 2, wherein the first spacer is spaced apart from the second spacer in the first horizontal direction by a first distance, and the third spacer is spaced apart from the fourth spacer in the first horizontal direction by the first distance.

4. The integrated circuit device of claim 2, further comprising a top source/drain contact contacting the top source/drain region,
   wherein the top source/drain region is between the top source/drain contact and the channel region, and the top source/drain contact comprises a material of the bottom source/drain contact.

5. The integrated circuit device of claim 2, wherein the second gate electrode extends along a bottom surface and a portion of a sidewall of the third spacer and a bottom surface and a portion of a sidewall of the fourth spacer.

6. The integrated circuit device of claim 2, wherein the VFET further comprises a gate insulator extending between the channel region and the second gate electrode.

7. The integrated circuit device of claim 1, wherein the first spacer comprises a side surface facing the second spacer, and
wherein the side surface of the first spacer is vertically aligned with a side surface of the gate electrode.

8. The integrated circuit device of claim 1, wherein the bottom source/drain contact comprises a metallic layer.

9. The integrated circuit device of claim 8, wherein an upper surface of the bottom source/drain contact is closer to the substrate than to an upper surface of the first spacer.

10. The integrated circuit device of claim 1, wherein the bottom source/drain contact contacts a portion of an upper surface of the gate electrode.

11. The integrated circuit device of claim 1, wherein the bottom source/drain contact comprises a first semiconductor layer and a second semiconductor layer on the first semiconductor layer, and both the first semiconductor layer and the second semiconductor layer comprise a first conductivity type impurity element.

12. The integrated circuit device of claim 11, wherein an upper surface of the bottom source/drain contact and an upper surface of the first spacer are coplanar with each other.

13. The integrated circuit device of claim 11, wherein the first semiconductor layer on the bottom source/drain region is connected to the bottom source/drain region, and
wherein the second semiconductor layer connects the first semiconductor layer to the gate electrode.

14. An integrated circuit device comprising:
a bottom source/drain region on an active region of a substrate;
a bottom spacer extending along an upper surface of the bottom source/drain region;
a bottom source/drain contact that extends through the bottom spacer and is connected to the bottom source/drain region; and
a gate electrode that is on the bottom spacer and is connected to a side surface of the bottom source/drain contact.

15. The integrated circuit device of claim 14, further comprising a plurality of spacers on the gate electrode,
wherein the plurality of spacers are spaced apart from each other and comprises a first spacer and a second spacer,
wherein the bottom source/drain contact is between the first spacer and the second spacer.

16. The integrated circuit device of claim 15, wherein the plurality of spacers further comprises a third spacer and a fourth spacer,
wherein the first spacer, the second spacer, the third spacer and the fourth spacer are spaced apart from each other in a first horizontal direction,
wherein the gate electrode comprises a first gate electrode,
wherein the integrated circuit device further comprises a vertical field-effect transistor (VFET) on the active region of the substrate, and the VFET comprises:
a channel region between the third spacer and the fourth spacer, the channel region contacting the bottom source/drain region;
a second gate electrode on a side surface of the channel region; and
a top source/drain region on the second gate electrode between the third spacer and the fourth spacer.

17. The integrated circuit device of claim 16, wherein the first spacer is spaced apart from the second spacer in the first horizontal direction by a first distance, and the third spacer is spaced apart from the fourth spacer in the first horizontal direction by the first distance.

18. The integrated circuit device of claim 16, further comprising a top source/drain contact contacting the top source/drain region,
wherein the top source/drain region is between the top source/drain contact and the channel region, and the top source/drain contact comprises a material of the bottom source/drain contact.

19. The integrated circuit device of claim 15, wherein the first spacer comprises a side surface facing the second spacer, and
wherein the side surface of the first spacer is vertically aligned with a side surface of the gate electrode.

20. An integrated circuit device comprising:
a bottom source/drain region on an active region of a substrate;
a bottom spacer extending along an upper surface of the bottom source/drain region;
a plurality of spacers on the bottom spacer, wherein the plurality of spacers are spaced apart from each other and comprise a first spacer and a second spacer;
a bottom source/drain contact between the first spacer and the second spacer, wherein the bottom source/drain contact extends through the bottom spacer;
a gate electrode between the bottom spacer and the plurality of spacers;
a gate insulator between the gate electrode and the bottom spacer; and
an insulating layer covering an upper surface of the bottom source/drain contact,
wherein the bottom source/drain contact contacts both the first spacer and the second spacer and electrically connects the gate electrode to the bottom source/drain region.

* * * * *